(12) United States Patent
Yoshikawa et al.

(10) Patent No.: US 9,087,160 B2
(45) Date of Patent: Jul. 21, 2015

(54) ELECTRONIC DEVICE AND SEMICONDUCTOR DEVICE

(71) Applicant: Renesas Electronics Corporation, Kawasaki-shi, Kanagawa (JP)

(72) Inventors: Yasuhiro Yoshikawa, Kanagawa (JP); Motoo Suwa, Kanagawa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 80 days.

(21) Appl. No.: 14/060,613

(22) Filed: Oct. 23, 2013

(65) Prior Publication Data

US 2014/0115199 A1 Apr. 24, 2014

(30) Foreign Application Priority Data

Oct. 24, 2012 (JP) ................. 2012-234525

(51) Int. Cl.
*H01L 23/48* (2006.01)
*G06F 3/00* (2006.01)
*G06F 13/40* (2006.01)
*G06F 13/38* (2006.01)
*H01L 23/498* (2006.01)
*H05K 1/02* (2006.01)
*H01L 23/552* (2006.01)
*H01L 25/10* (2006.01)
*H01L 23/00* (2006.01)

(52) U.S. Cl.
CPC .......... *G06F 13/4068* (2013.01); *G06F 13/385* (2013.01); *H01L 23/49838* (2013.01); *H05K 1/0216* (2013.01); *H01L 23/49816* (2013.01); *H01L 23/552* (2013.01); *H01L 24/16* (2013.01); *H01L 24/32* (2013.01); *H01L 24/48* (2013.01); *H01L 25/105* (2013.01); *H01L 2224/16227* (2013.01); *H01L 2224/48227* (2013.01); *H01L 2224/73265* (2013.01); *H01L 2924/00014* (2013.01); *H01L 2924/15192* (2013.01); *H01L 2924/15311* (2013.01); *H01L 2924/15331* (2013.01)

(58) Field of Classification Search
CPC .............. G06F 13/4068; H05K 1/0216; H01L 2224/16227; H01L 23/49816; H01L 23/49838; H01L 2224/48227
USPC .................................... 257/737, 776; 710/51
See application file for complete search history.

(56) References Cited

U.S. PATENT DOCUMENTS

| 6,285,079 B1 * | 9/2001 | Kunikiyo ...................... 257/737 |
| 2003/0023958 A1 | 1/2003 | Patel et al. |
| 2005/0006739 A1 * | 1/2005 | Howard et al. ............... 257/678 |

FOREIGN PATENT DOCUMENTS

| JP | 2005-531863 A | 10/2005 |
| JP | 2008-153288 A | 7/2008 |

* cited by examiner

*Primary Examiner* — Ernest Unelus
(74) *Attorney, Agent, or Firm* — Miles & Stockbridge P.C.

(57) ABSTRACT

There is a need to alleviate or reduce crosstalk between bonding wires or wires in a device substrate. One selection configuration divides a multiplexed terminal group into three groups according to functions differently from another selection configuration that divides the multiplexed terminal group into two groups. A first multi-pin semiconductor device is configured such that the groups are successively arranged along one edge of the chip. The first semiconductor device connects with a second semiconductor device via a multiplexed terminal group. The multiplexed terminal group includes first through third interface terminal groups that differ from each other in signal input/output configurations.

12 Claims, 12 Drawing Sheets

ELECTRONIC DEVICE AND SEMICONDUCTOR DEVICE

CROSS-REFERENCE TO RELATED APPLICATIONS

The disclosure of Japanese Patent Application No. 2012-234525 filed on Oct. 24, 2012 including the specification, drawings and abstract is incorporated herein by reference in its entirety.

BACKGROUND

The present invention relates to an electronic device and a semiconductor device. The electronic device includes a mounting board mounted with multiple semiconductor devices and is used for communication terminals, for example. The semiconductor device includes a multiplexed terminal and is mounted over the electronic device. More particularly, the invention relates to a technology applicable to mobile telephones.

According to the technology disclosed in patent document 1, a first processor is provided with a memory subsystem. A second intermediate processor is inserted into a communication path between the first processor and the memory subsystem. A memory transaction is transmitted to the second processor. The memory transaction is controlled so as to reach the memory subsystem when the memory transaction is allowed to pass through the second processor. In short, the first processor supplies the memory with an access signal via the second processor to enable access to the memory.

According to patent document 2, a data-based interface circuit portion and a command/address-based interface circuit portion are blocked separately from each other along chi peripheral edges such that SDRAM is connected with a memory interface circuit for a microcomputer.

Patent Document 1. Japanese Unexamined Patent Application Publication (Translation of PCT Application) No. 2005-531863

Patent Document 2: Japanese Unexamined Patent Application Publication No 2008-153288

SUMMARY

For example, FIG. 1A in patent document 1 illustrates topology that connects the memory, to a baseband processor. FIG. 2A in the same illustrates a topology that connects an application processor to the baseband processor and connects the memory to the application processor. The inventors examined a semiconductor device including the baseband processor available for any of these topologies. Obviously, a circuit portion interfacing with the semiconductor device represented by the application processor differs from a circuit portion interfacing with the memory. Both circuit portions may use specifically designed external terminals as interface terminals but may preferably use multiplexed terminals when possible in consideration of restrictions on an external size or the number of terminals of the semiconductor device.

If the multiplexed terminals are used, however, both circuit portions differ in signal uses or signal input/output configurations. The connection counterpart uses a different external terminal arrangement. The inventors found difficulty in the arrangement of bonding wires (or bonding pads connecting with the bonding wires) in the semiconductor device or the wiring arrangement in a device substrate if the arrangement of the multiplexed terminals as external terminals is settled merely based on the corresponding terminal arrangement as a counterpart. For example, the arrangement (layout) of external terminals (for interface) for the semiconductor device having the baseband processor is settled in accordance with the arrangement (layout) of external interface terminals (pins) for the memory or the application processor electrically connected with the baseband processor. This effectively facilitates the wiring layout of a wiring substrate (mounted with electronic components). As illustrated in FIG. 4 of patent document 2, it is preferable to collectively arrange the same type of interface terminals. As illustrated in FIG. 13 of patent document 2, it is also preferable to use external interface terminals that are included in the external terminals for the baseband processor and are arranged as proximately as possible to the connection counterpart. Such external terminals are often arranged along the peripheral portion. However, types or the number of interfaces depend on electronic components electrically connected with the baseband processor. We found that a crosstalk noise easily occurs in the semiconductor device mounted with the baseband processor if pins are assigned in an external interface terminal for the semiconductor device mounted with the baseband processor merely based on the above-mentioned criterion so as to be compatible with multiple electronic parts (such as the memory and the application processor).

These and other objects and novel features of the invention may be readily ascertained by referring to the following description and appended drawings.

The following summarizes a representative embodiment disclosed in this application.

One selection configuration divides a multiplexed terminal group into three groups according to functions differently from another selection configuration that divides the multiplexed terminal group into two groups, for example. A first multi-pin semiconductor device is configured such that the groups are successively arranged along one edge of the chip. The first semiconductor device connects with a second semiconductor device via a multiplexed terminal group. The multiplexed terminal group includes first through third interface terminal, groups that differ from each other in signal input/output configurations.

The following summarizes an effect provided by the representative aspects of the invention disclosed in this application.

The first through third interface terminal groups are successively arranged along one edge of the chip. Therefore, the interface terminal groups can alleviate or reduce crosstalk between bonding wires or wires in the device substrate compared to terminals that differ in signal input/output configurations along the arrangement direction.

DETAILED DESCRIPTION

1. Embodiment Overview

Figure 1:
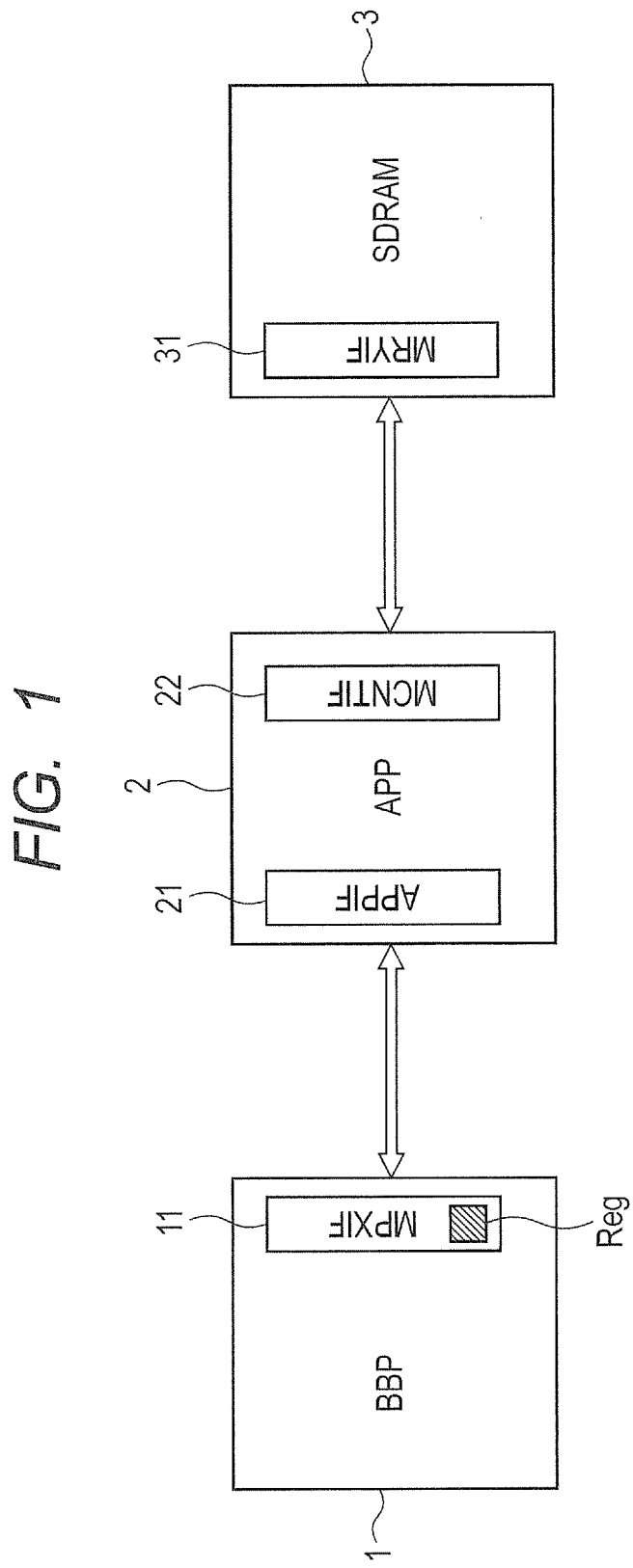
FIG. 1 illustrates a first system configuration in which an application processor is connected with a baseband processor and synchronous DRAM is connected with the application processor.

The following summarizes a representative embodiment disclosed in this application. In the following description, parenthesized reference numerals correspond to those shown in the appended drawings and just denote examples belonging to the concept of the corresponding components.

<1> Structure of an Electronic Device Including a First Semiconductor Device (BBP) Having Multiplexed Terminals and a Second Semiconductor Device (APP) Connected with the First Semiconductor Device An electronic device (FIGS. 1 and 3) includes amounting board (4), a first semiconductor device (1), and a second semiconductor device (2).

A first semiconductor device (1) is mounted over the mounting board, and includes a first wiring substrate (100), a first semiconductor chip (101) mounted over a chip mounting surface of the first wiring substrate, and a plurality of external terminals (102), electrically connected with the first semiconductor chip and formed on a mounting face opposite the chip mounting surface of the first wiring substrate.

A second semiconductor device includes a second wiring substrate (200) a second semiconductor chip (201) mounted over a chip mounting surface of the second wiring substrate, and a plurality of external terminals (202). The second semiconductor device is mounted over the mounting board and is electrically connected with the first semiconductor device. The external terminals are electrically, connected with the second semiconductor chip and are formed on a mounting face opposite to the chip mounting surface of the second wiring substrate.

The external terminals of the first semiconductor device are formed in a plurality of rows and arranged along each edge of the mounting face of the first wiring substrate, in a plan view.

The external terminals of the first semiconductor device include a first external terminal group (102_1) at a peripheral portion side of the mounting face of the first wiring substrate, and a second external terminal group (102_2) arranged further at a central portions side of the mounting face thereof than the first external terminal group.

An interval between the first external terminal group and the second external terminal group is larger than a diameter of each of the external terminals.

The first semiconductor device is mounted over the mounting board such that a first edge of edges of the mounting face of the first wiring substrate faces the second semiconductor device.

The external terminals of the first semiconductor device include a plurality of interface terminals (102_apif) connected with the second semiconductor device.

The interface terminals are arranged along the first edge (100_1) of the mounting face of the first wiring substrate and arranged further at the first edge side of the mounting face thereof than the central portion of the mounting face of the first wiring substrate.

The interface terminals include multiplexed terminals, such as a first interface terminal group (102_i), a second interface terminal group (102_o) and a third interface terminal group (102_io) having different signal input/output configurations from each other.

The first interface terminal group, the second interface terminal group and the third interface terminal group are distributed to the first external terminal group and the second external terminal group.

The second interface terminal group is arranged between the first interface terminal group and a second edge crossing to one end part of the first edge, in the plan view.

The third interface terminal group is arranged between the first interface terminal group and a third edge crossing to the other end part of the first edge, in the Plan view.

Figure 5:
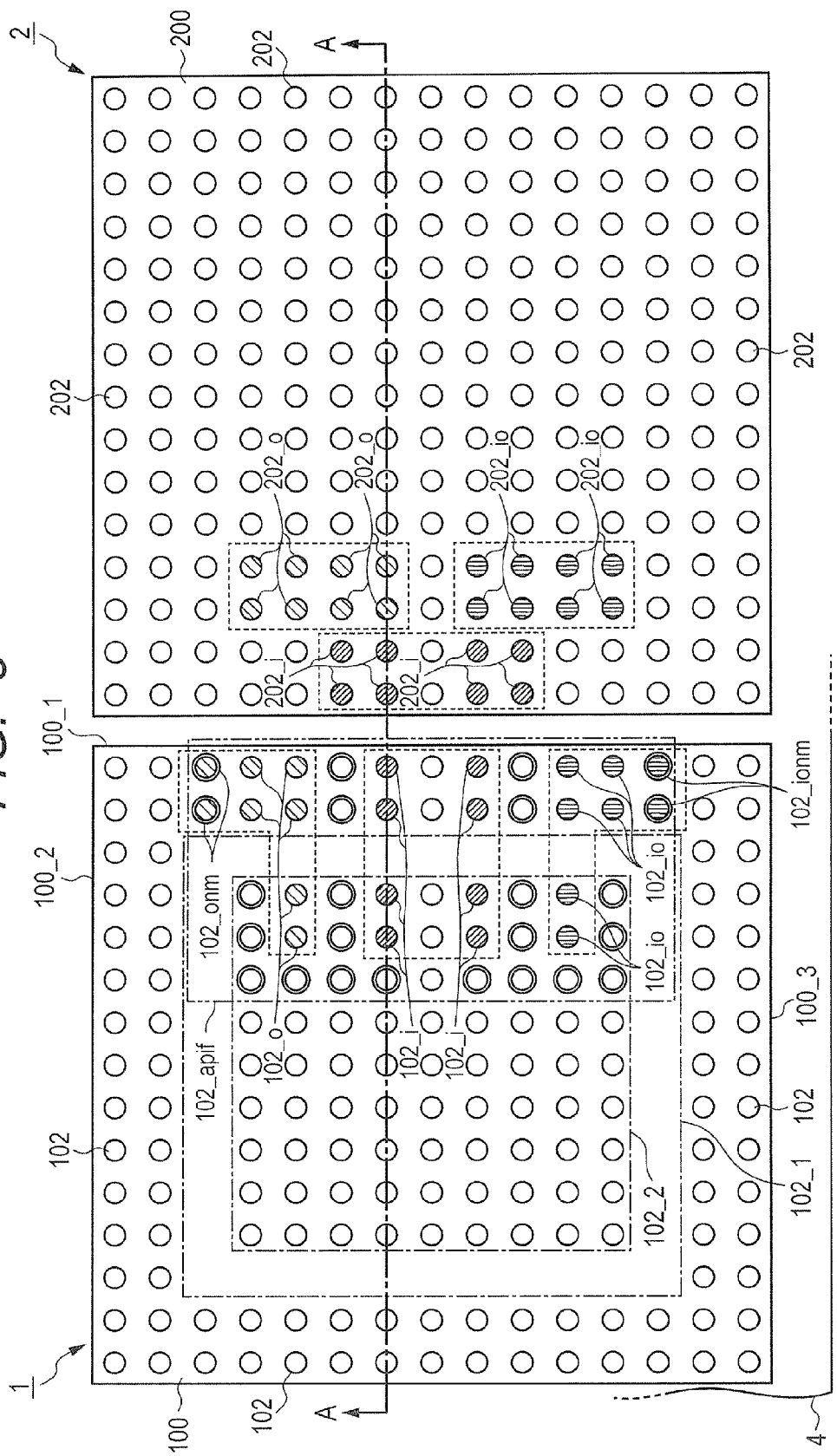
FIG. 5 is a plan view illustrating a relationship between the function arrangement assigned to multiplexed interface terminals of the baseband processor and the terminal arrangement of the application processor connected with the baseband processor according to the first system configuration illustrated in FIG. 1.

As described above, the first through third interface terminal groups have different signal input/output configurations from each other and are arranged along one edge of a chip in order as illustrated in FIG. 5, for example Therefore, the interface terminal groups can alleviate or reduce crosstalk between bonding wires or wires in the device substrate compared to terminals that differ in signal input/output configurations along the arrangement direction. Suppose that the multiplexed terminal arrangement, that is, the terminal arrangement of one connection target to be connected in multiplexed mode, is determined merely based on the arrangement of external terminals for interface with connection counterpart (other electronic components mounted on the mounting board). Then crosstalk is supposed to occur according to the arrangement of bonding wires (or bonding pads connect with bonding wires in the semiconductor device or the wiring arrangement in the device substrate. The interface terminal groups can prevent the possibility of crosstalk.

<2> Baseband Processor and Application Processor

According to item 1, the first semiconductor device is a baseband processor that provides specified communication protocol control for the electronic device. The second semiconductor device is an application processor that provides control other than the communication, protocol control for the electronic device.

The first through third interface terminal groups are assumed to connect with the processor as one multiplexed connection scheme. The terminal groups use different signal input/output configurations from each other. This favorably prevents degradation of the signal qualities throughout the electronic circuit. In other words, primary importance (preference) is given to connection between the processors (the baseband processor, and the application processor) with high, signal density compared to the memory. This favorably prevents degradation of the signal qualities throughout the electronic circuit. The high signal density signifies densely arranging signal terminals except the power terminal, ground terminals, and test terminals, for example.

<3> Assigning Signal Input/Output Configurations Different from Each Other to the First Through Third Interface Terminal Groups According to item 2, each of the first interface terminal group, the second interface terminal group and the third interface terminal group is assigned one of signal input/output configurations for an input terminal, an output terminal, and an input/output terminal without duplication.

The interface terminals are classified and arranged according to the signal input, output, and input/output as basic signal interface types. Therefore, it is possible to improve an effect of preventing the possibility of causing a crosstalk between signals with different signal transmission directions or between signals with large differences in change timings and speeds.

<4> Third Semiconductor Device

According to item 3, there is further provided a third semiconductor device (3). The third semiconductor device includes a third wiring substrate (300), a third semiconductor chip 301 mounted over a chip mounting surface of the third wiring substrate and multiple external terminals (302). The third semiconductor device is electrically connected with the second semiconductor device. The external terminals are electrically connected with the third semiconductor chip and are formed on a mounting face opposite to the chip mounting surface of the third wiring substrate.

This can provide an electronic circuit including the third semiconductor device.

<5> Synchronous DRAM

According to item 4, the third semiconductor device is synchronous DRAM.

The first and second semiconductor devices can use the synchronous DRAM as a shared resource. Data processing can be assigned to the baseband processor and the application processor.

<6> Region to Arrange Interface Terminals

According to item 1, the interface terminals are arranged in a region formed by the first edge (100_1) of the first wiring substrate and virtual lines (VTR1 and VTR2) connecting a central portion of the mounting face with both end parts of the first edge.

An empirical rule takes effect for the arrangement efficiency in consideration of the relationship between the arrangement of a circuit chip formed on the semiconductor chip and the arrangement of the external terminals for the circuit.

<7> Structure of the Semiconductor Device (BBP)

A semiconductor device (1) is mounted over a mounting board mounted with an electronic component and includes a first wiring substrate (100), a semiconductor chip (101), and multiple external terminals (102).

The semiconductor chip is mounted over a chip mounting surface of the wiring substrate.

The terminals are electrically connected with the semiconductor chip and formed on a mounting face opposite to the chip mounting surface of the wiring, substrate The external terminals of the semiconductor device are formed in rows and arranged along each edge of the mounting face of the wiring substrate, in a plan view.

The external terminals of the semiconductor device include a first external terminal group (102_1) arranged at a Peripheral portion side of the mounting face of the first wiring substrate and a second external terminal group (102_2) arranged further at a central portion side of the mounting face thereof than the first external terminal group.

An interval between the first external terminal group and the second external terminal group is larger than a diameter, of each of the external terminals.

The external terminals of the semiconductor device include multiple interface terminals (102_apif) connected with the outside (other electronic components).

The interface terminals are arranged along, a first edge (100_1) of the mounting face of the wiring substrate and arranged further at the first edge side of the mounting face thereof than the central portion of the mounting face thereof.

The interface terminals include multiplexed terminals, such as a first interface terminal group (102_i), a second interface terminal group (102_o) and a third interface terminal group (102_io) having different signal input/output configurations from each other.

The first interface terminal group, the second interface terminal group and the third interface terminal group are distributed to the first external terminal group and the second external terminal group.

The second interface terminal group is arranged between the first interface terminal group and a second edge crossing to one end part of the first edge, in the plan view.

The third interface terminal group is arranged between the first interface terminal group and a third edge crossing to the other end part of the first edge, in the plan view.

As described above, the first through third interface terminal groups have different signal input/output configurations from each other and are arranged along one edge of a chip in order as illustrated in FIG. 5, for example. Therefore, the interface terminal groups can alleviate or reduce crosstalk between bonding wires or wires in the device substrate compared to terminals that differ in signal input/output configurations along the arrangement direction. Suppose that the multiplexed terminal arrangement, that is, the terminal arrangement of one connection target to be connected in multiplexed mode, is determined merely based on the arrangement of external terminals for interface with connection counterpart (other electronic components mounted on the mounting board). Then crosstalk is supposed to occur according to the arrangement of bonding wires or bonding pads to connect with bonding wires in the semiconductor device or the wiring arrangement in the device substrate. The interface, terminal groups can prevent the possibility of crosstalk.

<8> Baseband Processor

According to item 7, the first semiconductor device is baseband processor that provides specified communication protocol control for the electronic device.

The first through third interface terminals use different signal input/output configurations from each other. Suppose that the terminal groups connect with the processor as one connection scheme in multiplexed mode. Then the terminal groups favorably prevent degradation of qualities of signals for interface with the outside. In other words, suppose the connection between processors (e.g., connection with an application processor) with high signal density compared to the memory. Then the terminal groups favorably prevent degradation of qualities of signals for interface with the outside.

<9> Assigning Signal Input/Output Configurations or Signal Uses to Multiplexed Terminals According to item 8, when one function is selected for multiple interface terminals including the multiplexed terminal, each of the first interface terminal group, the second interface terminal group, and the third interface terminal group is assigned one of signal input/output configurations for an input terminal, an output terminal, and an input/output terminal without duplication. When another function is selected, each of part of the first interface terminal group and the second interface terminal group and part of the first interface terminal group and the third interface terminal group is assigned one of signal uses for a command/address-based terminal function and a data-based terminal function of memory without duplication.

In terms of the arrangement of other terminals to be connected in a multiplexed mode, the first through third interface terminal groups can be assigned to two functions, that is, the command/address-based terminal function for memory and the data-based terminal function.

<10> Region to Arrange Interface Terminals

According to item 7, the interface terminals are arranged in a region formed by the first edge (100_1) of the first wiring substrate and virtual lines (VTR1 and VTR2) connecting a central portion of the mounting face with both end parts of the first edge.

An empirical rule takes effect for the arrangement efficiency in consideration of the relationship between the arrangement of a circuit chip formed on the semiconductor chip and the arrangement of the external terminals for the circuit.

<11> System in which One Selection Configuration Divides a Multiplexed Terminal Group into Three Groups According to Functions, Differs from Another Selection Configuration to Divide the Multiplexed Terminal Group into Two Groups, and is Applied to a Multi-Pin Semiconductor Device Configured to Successively Arrange the Groups Along One Edge of a Chip An electronic device (FIGS. 1 and 3) includes a mounting board (4) a first semiconductor device (1), and a second semiconductor device (2).

The first semiconductor device is mounted over the mounting board, and includes a first wiring substrate (100), a first semiconductor chip (101) mounted over a chip mounting surface of the first wiring substrate, and multiple external terminals (102). The external terminals are electrically connected with the first semiconductor chip and are formed on a mounting face opposite to the chip mounting, surface of the first wiring substrate.

The second semiconductor device is mounted over the mounting board, and electrically connected with the first semiconductor device. The second semiconductor device includes a second wiring substrate (200), a second semiconductor chip (201) mounted over a chip mounting, surface of the second wiring substrate, and multiple external terminals (202) electrically connected with the second semiconductor chip and formed on a mounting face opposite to the chip mounting surface of the second wiring substrate.

The external terminals of the first semiconductor device are formed in a plurality of rows and arranged along each edge of the mounting face of the first wiring substrate, in a plan view.

The first semiconductor device is mounted over the mounting board such that a first edge (100_1) of edges, of the mounting face of the first wiring substrate faces the second semiconductor device.

The external terminals of the first semiconductor device include a plurality, of interface terminals (102_apif) connected with the second semiconductor device.

The interface terminals include a plurality of multiplexed terminals capable of dynamically assigning functions corresponding to an interface function assigned to the first semiconductor chip.

When the first semiconductor chip is assigned an interface function with the second semiconductor device, the multiplexed terminals are assigned as a first interface terminal group (102_i), a second interface terminal group (102_o), and a third interface terminal group (102_io) having different signal input/output configurations from each other. This assignment differs from assignment of the multiplexed terminals to a fourth interface terminal group (102_dq and 102_dqs) and a fifth interface terminal group (102_ca and 102_ck) having different signal input/output configurations from each other when the first semiconductor chip is assigned an interface function with a semiconductor device (3) other than the second semiconductor device, The first interface terminal group is arranged adjacently to the second interface terminal group along the first edge (100_1) of the mounting face of the first wiring substrate, in a plan view.

The second interface terminal group is arranged between the first interface terminal group and a second edge (100_2) crossing to one end part of the first edge, in the plan view The third interface terminal group is arranged between the first interface terminal group and a third edge (100_3) crossing to the other end part of the first edge, in the plan view.

Figure 6:
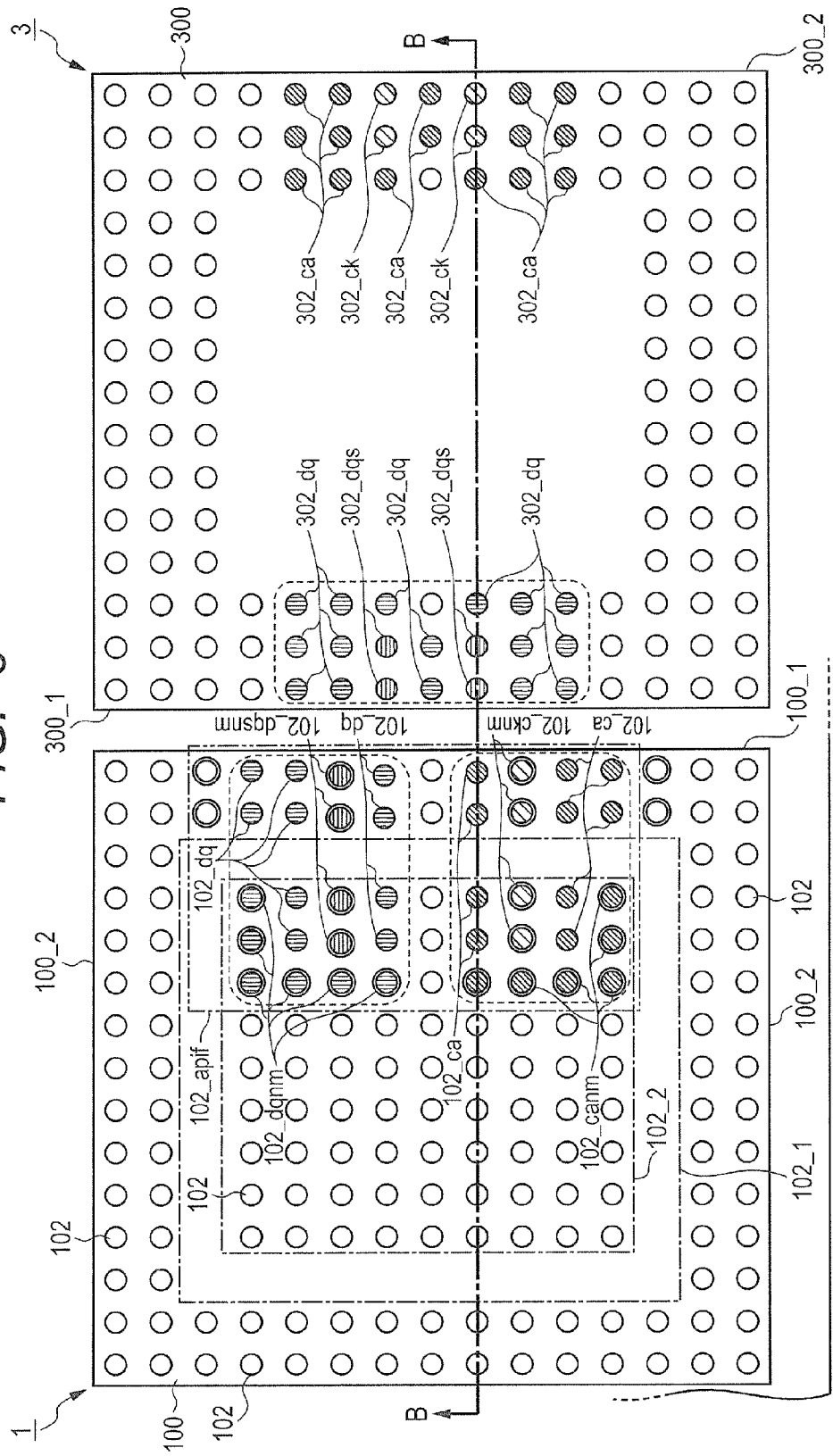
FIG. 6 is a plan view illustrating a relationship between the function arrangement assigned to a multiplexed interface terminal of the baseband processor and the terminal arrangement of the synchronous DRAM connected with the baseband processor according to the second system configuration illustrated in FIG. 2.

As described above, the first through third interface terminal groups have different signal input/output configurations from each other and are arranged along one edge of a chip in order as illustrated in FIG. 5, for example Therefore, the interface terminal groups can alleviate or reduce crosstalk between bonding wires or wires in the device substrate compared to terminals that differ in signal input/output configurations along the arrangement direction. Suppose that the multiplexed terminal arrangement, that is, the terminal arrangement of one connection target to be connected in multiplexed mode, is determined merely based on the arrangement of external terminals for interface with connection counterpart (other electronic components mounted on the mounting board). Then crosstalk is supposed to occur according to the arrangement of bonding wires (or bonding pads to connect with bonding wires) in the semiconductor device or the wiring arrangement in the device substrate. The interface terminal groups can prevent the possibility of crosstalk. The multiplexed terminals are assigned the first through third interface terminal groups having different signal input/output configurations from each other. The meaning of the terminal group assignment differs from the fourth and fifth interface terminal groups having different signal uses from each other as illustrated in FIG. 6 for example. The interface terminals are classified and arranged according to signal input/output configurations as basic signal interface types. Therefore, it is possible to improve an effect of preventing the possibility of causing a crosstalk between signals with different signal transmission directions or between signals with large differences in change timings and speeds.

<12> Baseband Processor and Application Processor

According to, item 11, the first semiconductor device is a baseband processor that provides specified communication protocol control for the electronic device. The second semiconductor device is an application processor that provides control other than the communication protocol control for the electronic device.

The first through third interface terminal groups are assumed to connect with the processor as one multiplexed connection scheme. The terminal groups use different signal input/output configurations from each other. This favorably prevents degradation of the signal qualities throughout the electronic circuit. In other words, the terminal groups use different signal input/output configurations from each other for connection between the processors (the baseband processor and the application processor) with high signal density compared to the memory. This favorably prevents degradation of the signal qualities throughout the electronic circuit <13> Assigning Signal Input/Output Configurations or Signal Uses to Multiplexed Terminals According to item 12, each of the first interface terminal group, the second interface terminal group, and the third interface terminal group is assigned one of signal input/output configurations for an input terminal an output terminal, and an input/output terminal without duplication as illustrated in FIG. 5, for example. Each of the fourth interface terminal group and the fifth interface terminal group is assigned one of signal uses for a command/address-based terminal and a data-based terminal of synchronous DRAM without duplication as illustrated in FIG. 6, for example.

The interface terminals are classified and arranged according to the signal input, output, and input/output as basic signal interface types. Therefore, it is possible to improve an effect of preventing the possibility of causing a crosstalk between signals with different signal transmission directions or between signals with large differences in change timings and speeds. In terms of the arrangement of other terminals to be connected in a multiplexed mode, the fourth and fifth interface terminal groups can be assigned to the command/address-based terminal function for memory and the data-based terminal function.

<14> Further Providing a Third Semiconductor Chip

According to item 13, there is further provided a third semiconductor device (3) electrically connected with the second semiconductor device and including a third wiring substrate (300), a third semiconductor chip (301) mounted over a chip mounting surface of the third wiring substrate, and multiple external terminals (302). The external terminals are electrically connected with the third semiconductor chip and are formed on a mounting face opposite to the chip mounting surface of the third wiring substrate This can provide an electronic circuit including the third semiconductor device.

<15> Synchronous DRAM

According to item 14, the third semiconductor device is synchronous DRAM.

The first and second semiconductor devices can use the synchronous DRAM as a shared resource. Data processing can be sync assigned to the baseband processor and the application processor.

<16> Multi-Pin Semiconductor Device in which One Selection Configuration Divides Multiplexed Terminals into Three Groups According to Functions, Another Selection Configuration Divides Multiplexed Terminals into Two Groups According to Functions, and the Groups are Successively Arranged Along One Edge of a Chip A semiconductor device (1) includes a wiring substrate (100), a semiconductor chip (101) mounted on a chip mounting surface of the wiring substrate, and multiple external terminals 102 that are electrically connected with the semiconductor chip and formed on a mounting face opposite to the chip mounting surface of the wiring substrate The external terminals of the semiconductor device are formed in a plurality of rows and arranged along each edge of the mounting face of the wiring substrate, in a plan view The external terminals of the semiconductor device include multiple interface terminals (102_apif) connectable to other semiconductor devices.

The interface terminals include multiple multiplexed terminals capable of dynamically assigning functions corresponding to an external interface function assigned to the semiconductor chip.

When a first external interface function is specified as the external interface function, the multiplexed terminals are assigned as a first interface terminal group (102_i), a second interface terminal group (102_o), and a third interface terminal group (102_io) having different signal input/output configurations from each other.

When a second external interface function is specified as the external interface function, the multiplexed terminals are assigned as a fourth interface terminal group (102_dq and 102_dqs) and a fifth interface terminal group (102_ca and 102_ck) having different signal uses from each other.

The first interface terminal group is arranged adjacently to the second interface terminal group along the first edge (100_1) of the mounting face of the wiring substrate, in a plan view.

The second interface terminal group is arranged between the first interface terminal group and a second edge (100_2) crossing to one end part of the first edge, in the plan view.

The third interface terminal group is arranged between the first interface terminal group and a third edge (100_3) crossing to the other end part of the first edge, in the plan view.

The fourth interface terminal group is arranged adjacently to the fifth interface terminal group along the first edge on the mounting face of the wiring substrate the plan view.

The fifth interface terminal group is arranged between the fourth interface terminal group and an edge crossing to the first edge, in the plan view.

As described above, the first through third interface terminal groups have different signal input/output configurations from each other and are arranged along one edge of a chip in order as illustrated in FIG. 5, for example. Therefore, the interface terminal groups can alleviate or reduce crosstalk between bonding wires or wires in the device substrate compared to terminals that differ in signal input/output configurations along the arrangement direction. Suppose that the multiplexed terminal arrangement, that is, the terminal arrangement of one connection target to be connected in multiplexed mode, is determined merely based on the arrangement of external terminals for interface with connection counterpart (other electronic components mounted on the mounting board). Then crosstalk is supposed to occur according to the arrangement of bonding wires (or bonding pads connect with bonding wires) in the semiconductor device or the wiring arrangement in the device substrate. The interface terminal groups can prevent the possibility of crosstalk. The multiplexed terminals are assigned the first through third interface terminal groups having different signal input/output configurations from each other. The meaning of the terminal group assignment differs from the fourth and fifth interface terminal groups having different signal uses from each other as illustrated in FIG. 6, for example. The interface terminals are classified and arranged according to signal input/output configurations as basic signal interface types. Therefore, it is possible to improve an effect of preventing the possibility of causing a crosstalk between signals with different signal transmission directions or between signals with large differences in change timings and speeds.

<17> Baseband Processor

According to item 16, the semiconductor device is a baseband processor that provides specified communication protocol control.

The first through third interface terminals use different signal input/output configurations from each other. Suppose that the terminal groups connect with the processor as one connection scheme in multiplexed mode. Then the terminal groups favorably prevent degradation of qualities of signals for interface with outside. In other words, suppose the connection between processors (e.g., connection with an application processor) with high signal density compared to the memory. Then the terminal groups favorably Prevent degradation of qualities of signals for interface with the outside.

<18> Assigning Signal Input/Output Configurations or Signal Uses to Multiplexed Terminals According to item 17 when one function is selected for plurality of interface terminals including the multiplexed terminal, each of the first interface terminal group, the second interface terminal group, and the third interface terminal group is assigned one of signal input/output configurations for an input terminal, an output terminal, and an input/output terminal without duplication. When another function is selected for a plurality of interface terminals including the multiplexed terminal, each of the fourth interface terminal group and the fifth interface terminal group is assigned one of signal uses for a command/address-based terminal and data-based terminal of synchronous DRAM without duplication.

In terms of the arrangement of other terminals to be connected in a multiplexed mode, the first through third interface terminal groups can be assigned to two functions, that is, the command/address-based terminal function for synchronous DRAM and the data-based terminal function.

<19> Non-Multiplexed Terminal

According to item 18, the interface terminals are provided with a fixed terminal function and include multiple non-multiplexed terminals (102_onm, 102_ionm, 102_dqnm, 102_dqsnm, 102_canm, and 102_cknm) used for connection to the synchronous DRAM. The non multiplexed terminals include differential terminals (102_dqsnm) for data strobe signals configuring differential pairs and include differential terminals (102_cknm) for clock signals configuring differential pairs.

The terminals as differential pairs are provided as non-multiplexed terminals to prevent the differential signal functionality from degrading due to a multiplexed circuit configuration.

<20> Storage Circuit Provided with the External Interface Function

According to item 18, there is further provided a storage circuit (Reg) that configures the first external interface function or the second external interface function.

Figure 2:
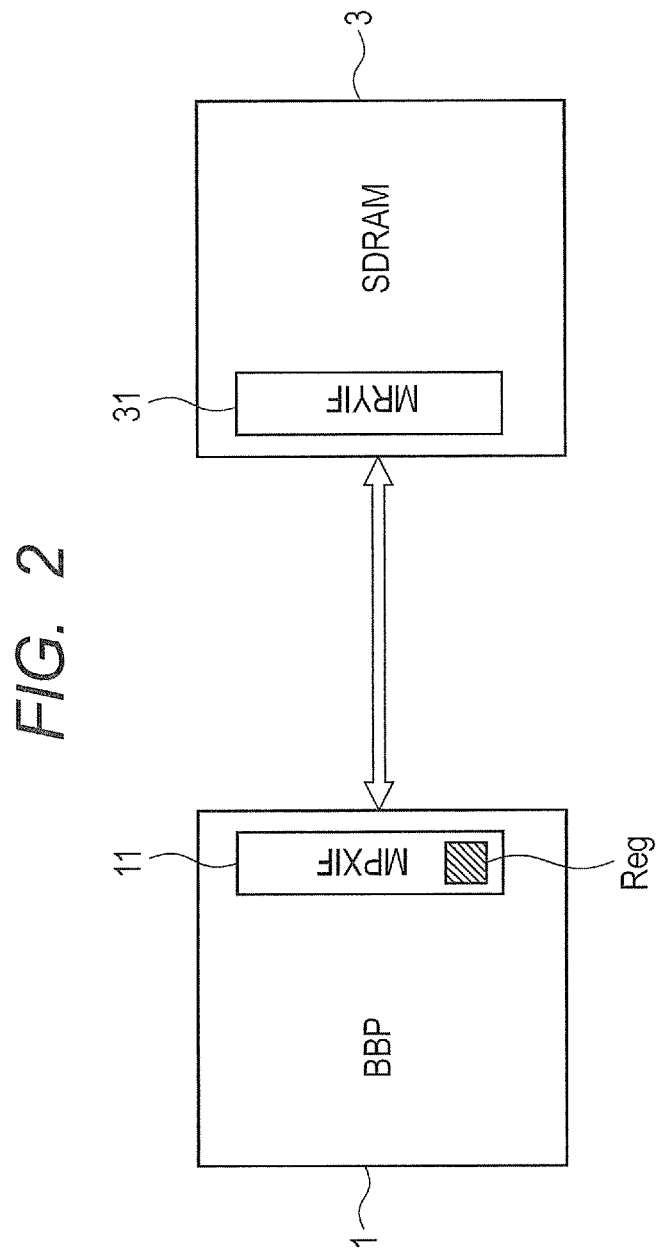
FIG. 2 illustrates a second system configuration in which synchronous DRAM is connected with a baseband processor.

Writing control data to the storage circuit such as a register or a nonvolatile storage element easily provides the first external interface function or the second external interface function 2. Detailed Description of the Embodiment The embodiment will be described in more detail.
<System Configuration of the Electronic Device>
The following description uses a mobile communication processor having a multiplexed terminal. FIGS. 1 and 2 provide representative examples of system configurations for the baseband processor. FIG. 1 illustrates a first system configuration that connects an application processor (APP) 2 a baseband processor (BBP) 1 and connects synchronous DRAM (SDRAM) 3 to the application processor 2. FIG. 2 illustrates a second system configuration when selecting a connection scheme that directly connects the synchronous DRAM (SDRAM) 3 to the baseband processor (BBP) 1.

The baseband processor 1 has first and second external interface functions. The first external interface function enables interface with the application processor 2 via a multiplexed terminal. The second external interface function enables direct interface with the synchronous DRAM 3 via a multiplexed terminal. FIG. 1 illustrates that the first external interface function is selected. FIG. 2 illustrates that the second external interface function is selected.

In the drawings, the baseband processor 1 exemplifies data processing semiconductor devices such as microprocessors and microcomputers. Basically, the baseband processor 1 is connected with a high-frequency portion (not shown) and, processes transmission data supplied to the high-frequency Portion or reception data received by the high-frequency portion according to a specified communication protocol. In short, the baseband processor 1 performs specified communication protocol processes on a baseband basis. The application processor also exemplifies data processing semiconductor devices such as microprocessors and microcomputers. The application processor is positioned as an accelerator that reduces data processes on the baseband processor 1.

The first system configuration in FIG. 1 allows the application processor 2 to perform application processes such as display control and key input control in order to reduce data processing loads on the baseband processor 1. The synchronous DRAM 3 ensures data areas used for protocol processes and application processes. During a protocol Process, the baseband processor 1 accesses the synchronous DRAM 3 using a through-path in the application processor 2. Alternatively, the baseband processor 1 uses the synchronous DRAM 3 by issuing a memory access command to the application processor 2.

The second system configuration in FIG. 2 allows the baseband processor 1 to control application processes such as display control and key input control according to the corresponding programs. The synchronous DRAM 3 ensures data areas used for protocol processes and application processes.

The baseband processor 1 is compatible with both system configurations in FIGS. 1 and 2 and includes a multiplexed interface (MPXIF) 11 compatible with the first and second system configurations. For example, the multiplexed interface 11 includes a memory interface controller and an interprocessor interface circuit that are not illustrated. The memory interface controller controls the memory according to memory interface; specifications of the synchronous DRAM 3 when a CPU (central processing unit) of the baseband processor accesses the synchronous DRAM 3 using load or store instructions. The interprocessor interface circuit provides interprocessor interface with the application processor 2 for addresses, data, and commands. One external terminal may connect the memory interface controller to the synchronous DRAM 3. Another external terminal may connect the interprocessor interface circuit to the application processor 2. These external terminals may differ from each other as dedicated terminals and may be assigned to packages. However, the embodiment basically uses multiplexed terminals as the external terminals in consideration of the semiconductor device miniaturization or restriction on the number of external terminals.

The multiplexed terminal provides one terminal with two or more selectable terminal functions.

Basically, a circuit (not shown) to select terminal functions for the multiplexed terminal connects the multiplexed terminal to the interprocessor interface or the memory interface controller via a selector or a signal buffer. Basically, control data setting values for a specified storage circuit determine whether the circuit to select terminal functions allows the baseband processor 1 to select the first or second external interface function. The specified, storage circuit represents a register Reg illustrated in FIGS. 1 and 2 or a nonvolatile storage device (not shown), for example. The CPU software may configure the storage circuit immediately after power-on reset on the baseband processor. The storage circuit may be replaced by a mode terminal supplied with a fixed potential to set values.

The synchronous DRAM 3 includes a memory interface (MRYIF) 31 whose external terminals comply with specifications in the JEDEC standards and are classified into data-based terminals such as data and data strobes and command/address-based terminals such as commands (RAS, CAS, and WE) and addresses, for example. The application processor 2 includes an application processor interface (APPIF) 21 having external terminals for input, output, and input/output in compliance with bus connections. The multiplexed terminal for the baseband processor 1 is shared by two types of terminals as extensively as possible, that is, one including data-based and command/address-based terminals for the synchronous DRAM 3 and the other including input/output, and input/output terminals for the application processor 2. In FIG. 1, the application processor 2 includes a memory controller interface (MCNTIF) 22 connected with the memory interface controller that provides memory interface control for the synchronous DRAM 3. The memory controller interface (MCNTIF) 22 is connected with the memory interface (MRYIF) 31 for the synchronous DRAM 3.

<Physical Structure of the Electronic Device Having the First System Configuration>

Figure 3:
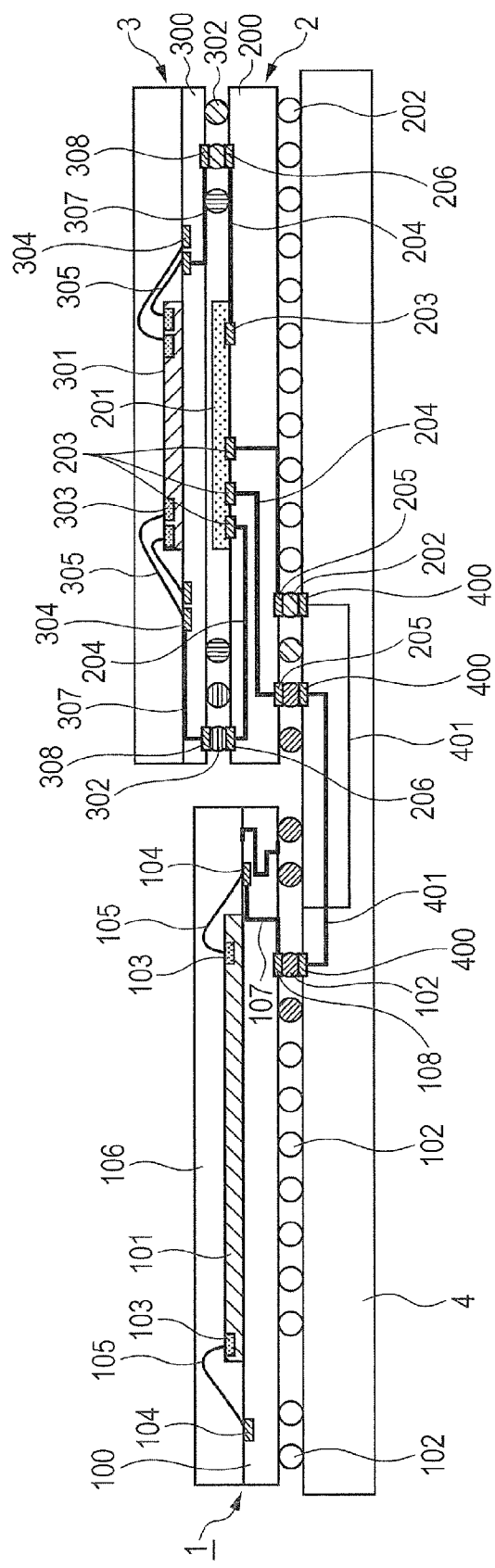
FIG. 3 is a vertical sectional view illustrating a schematic physical structure of an electronic device having the first system configuration illustrated in FIG. 1.

FIG. 3 is a vertical sectional view illustrating schematic physical structure of the electronic device having the first system configuration illustrated in FIG. 1. The electronic device in FIG. 3 includes a mounting board (wiring substrate) 4 such as a motherboard or an interposer substrate and electronic components 1, 2, and 3 mounted over the mounting board 4. Basically, the mounting board 4 includes multiple wiring layers. The surface (topmost plane) of the mounting board 4 is provided with many mounting pads 400 connected with the corresponding wiring layers. A wiring 401 is formed on the mounting board 4 and provides the mounting pads with specified wiring connections. The baseband processor 1 and the application processor 2 are mounted over the mounting board 4. The baseband processor 1 is provided as an example of the first semiconductor device (electronic component). The application processor 1 is provided as an example of the second semiconductor device electronic component. The synchronous DRAM 3 is mounted over the application processor 2 and is provided as an example of the third semiconductor device.

<Baseband Processor>

The baseband processor includes a first wiring substrate (interposer substrate) 100, a first, semiconductor chip (baseband processor chip) 101, and multiple external terminals 102. The first semiconductor chip 101 is mounted over a chip mounting surface (an outer surface or an upper surface in the drawing) of the first wiring substrate 100. The external terminals 102 are electrically connected with the first semiconductor chip 101 and formed on a mounting face (a rear surface or a lower surface in the drawing) opposite to the chip mounting surface of the first wiring, substrate 100. The first wiring substrate 100 according to the embodiment is rectangularly shaped, in a plan view. The first wiring substrate 100 includes multiple wiring layers (to form the wiring 107). The baseband processor 1 is mounted over a component mounting area of the mounting board 4. The external terminal 102 of the baseband processor 1 is connected with the specified mounting pad 400 of the mounting board 4.

The baseband processor chip (first semiconductor chip) 101 includes, though not illustrated, a CPU to execute programs program memory to retain programs executed by the CPU, RAM used as a CPU work area, a digital signal processing circuit, a timer/counter, and an external interface circuit such as an IO port, for example.

Bonding pads (electrodes) 103 are formed on the surface (main surface or device forming side) of the baseband processor chip 101. Bonding pads 103 and 104 are formed on the chip mounting surface (outer surface or upper surface in the drawing) of the first wiring substrate 100. As illustrated in FIG. 3, the baseband processor chip 101 is mounted over the first wiring substrate 100 such that the reverse side of the surface to form the bonding pads (bonding leads) 103 faces to the chip mounting surface of the first wiring substrate 100. The bonding pads 103 and 104 are electrically connected with bonding pads (electrodes) formed on the main surface (device forming side) of the first semiconductor chip 101 via conductive members (e.g., bonding wires 105). The bonding pads 103 and 104 are formed on the mounting face (rear surface or lower surface in the drawing) of the first wiring substrate 100 via the wiring 107 formed on the first wiring substrate 100 and are electrically connected with bump pads (lands) 108 with which the external terminal 102 is connected.

The surface of the baseband processor 1 is covered with a resin (sealant) 106. The resin (sealant) 106 seals (protects) the baseband processor chip (first semiconductor chip) 1 and the bonding wires 105 mounted on the chip mounting surface of the first wiring substrate.

<Application Processor>

The application processor 2 includes a second wiring substrate (interposer substrate) 200, a second semiconductor chip (application processor chip) 201, and multiple external terminals 202. The second semiconductor chip 201 is mounted on the chip mounting surface (outer surface or upper surface in the drawing) of the second wiring substrate 200. The external terminals 202 are electrically connected with the second semiconductor chip 201 and are formed on the mounting face (rear surface or lower surface in the drawing) opposite to the chip mounting surface of the second wiring substrate 200. The second wiring substrate 200 according to the embodiment is rectangularly shaped, in a plan view. The second wiring substrate 200 includes multiple wiring layers (to form a wiring 204). The application processor 2 is mounted over a component mounting area (different from that mounted with the baseband processor 1) of the mounting board 4. The external terminal 202 of the application processor 2 is connected, with the specified mounting pad 400 of the mounting board 4. The mounting pad 400 of the mounting board 4 is electrically connected with the application processor 2. The mounting pad 400 of the mounting board 4 is electrically connected with the baseband processor 1. Both mounting pads 4 are electrically connected with each other via the wiring 401 formed on the mounting board 4.

The application processor chip (second semiconductor chip) 201 includes, though not illustrated, a CPU to execute programs, program memory to retain programs executed by the CPU, RAM used as a CPU work area, a digital signal processing circuit, a timer/counter, and an external interface circuit such as an IO port, for example.

Bonding pads (not shown) are formed on the surface (main surface or device forming side) of the application processor chip 201. The bonding pads are provided with micro bumps (protruding electrodes). Micro bump pads (bonding leads) 203 are formed on the chip mounting surface (outer surface or upper surface in the drawing) of the second wiring substrate 200. The application processor chip 201 is flip-chip bonded to the second wiring substrate 200. As illustrated in FIG. 3, the application processor chip 201 is mounted on the second wiring substrate 200 such that the surface of the application processor chip 201 faces to the chip mounting surface of the second wiring substrate 200. The micro bump pads 203 are formed on the mounting face (rear surface or lower surface in the drawing) of the second wiring substrate 200 via the wiring 204 formed on the second wiring substrate 200. The micro bump pads 203 are connected with bump pads (lands) 205 connecting with the external terminal 202. The micro bump pads 203 are also connected with bump pads (lands) 206 formed on the chip mounting surface of the second wining substrate 200.

A resin or sealant (not shown) seals a space (gap) between the application processor chip 201 and the second wiring substrate 200. That is, the resin seals or protects a junction area between the micro bump pad 203 for the second wiring substrate and the micro bump for the application processor chip (second semiconductor chip) 201.

<Memory>

The synchronous DRAM 3 includes a third wiring substrate (interposer substrate) 300, a synchronous DRAM chip 301, and external terminals 302. The synchronous DRAM chip 301 is provided as a third semiconductor chip and is mounted on the chip mounting surface (outer surface or upper surface in the drawing) of the third wiring substrate 300. The external terminals 302 are electrically connected with the third semiconductor chip 301 and are formed on the mounting face opposite to the chip mounting surface of the third wiring substrate 300. The third wiring substrate 300 according to the embodiment is rectangularly shaped, in a plan view. The third wiring substrate 300 includes multiple wiring layers (to form a wiring 307).

The synchronous DRAM 3 includes, though not illustrated, a dynamic memory cell array, an address decoder, and a selection circuit that selects a memory cell from the dynamic memory cell array according to an address decoding result, for example. The synchronous DRAM 3 also includes a read/write circuit and timing generator. The read/write circuit amplifies read data for the selected memory cell and supplies the selected cell with rite data. The timing generator generates a timing signal for memory operation based on the clock synchronization.

Bonding pads (electrodes) 303 are formed on the surface (main surface or device forming side) of the synchronous DRAM chip 301. Bonding, pads (bonding leads) 304 corresponding to the bonding pads 303 are formed on the surface of the third wiring substrate 300. As illustrated in FIG. 3, the synchronous DRAM chip 301 is mounted on the third wiring substrate 300 such that the rear surface opposite to the outer surface to form the bonding pads (bonding leads) 303 faces to the chip mounting surface of the third wiring substrate 300, for example. The bonding pads 303 are electrically connected with the bonding pads 304 via conductive members (e.g., bonding wires 305). The bonding pads 304 are formed on the mounting face (rear surface or lower surface in the drawing) of the third wiring substrate 300 via the wiring 307 formed on the third wiring substrate 300. The bonding pads 304 are electrically connected with bump pads (lands) 308 connecting with the external terminals 302. The external terminals 302 are connected and fixed to the bump pads 206 formed on the second wiring substrate 200 to mount the synchronous DRAM 3 over the application processor 2.

<Physical Structure of the Electronic Device Having the Second System Configuration>

Figure 4:
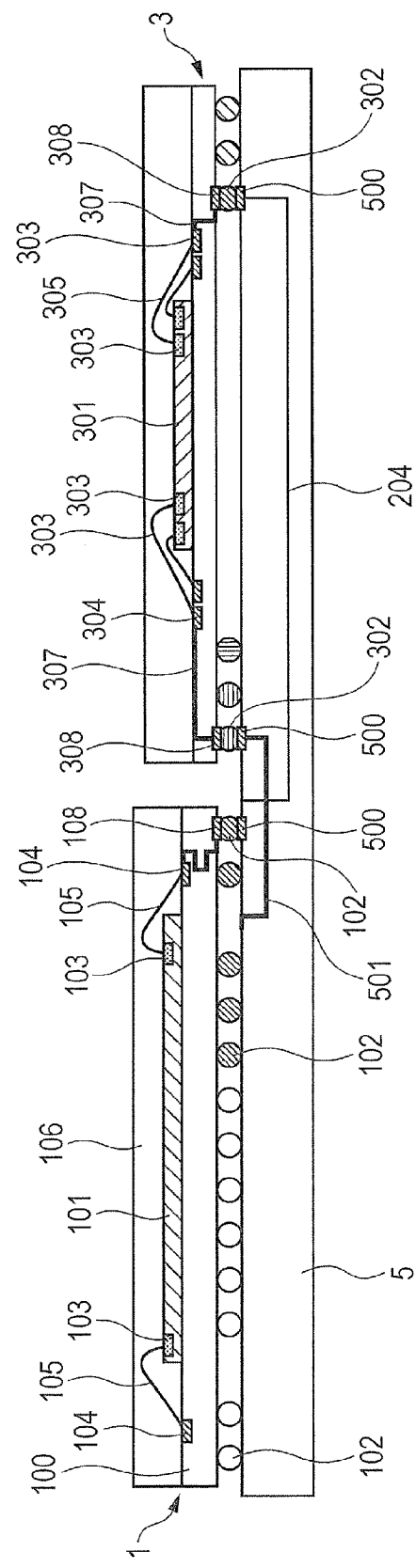
FIG. 4 is a vertical sectional view illustrating a schematic physical structure of an electronic device having the second system configuration illustrated in FIG. 2.

FIG. 4 is a vertical sectional view illustrating schematic physical structure of the electronic device having the second system configuration illustrated in FIG. 2. The electronic device in FIG. 4 includes a mounting board (wiring substrate) 5 such as a motherboard or an interposer substrate and electronic components 1 and 3 mounted over the mounting board 5. Basically, the mounting board 5 includes multiple wiring layers. The surface (topmost plane) of the mounting board 5 is provided with many mounting pads 500 connected with the corresponding wiring layers. A wiring 501 is formed on the mounting board 5 and provides the mounting pads 500 with specified wiring connections. The baseband processor 1 and the synchronous DRAM 3 are mounted over the mounting board 5. The baseband processor 1 is provided as an example of the first semiconductor device (electronic component). The synchronous DRAM 3 is provided as an example of the third semiconductor device (electronic component). The baseband processor 1 and the synchronous DRAM 3 in FIG. 4 equal those illustrated in FIG. 3. However, wiring 501 for a wiring substrate 5 differs from FIG. 3. In FIG. 3, providing the baseband processor 1 with the first, interface function forms the wiring 401 that can connect a corresponding terminal for the application processor to the multiplexed terminal. In FIG. 4, providing the baseband processor 1 with the second interface function forms the wiring 401 that can connect a corresponding terminal for the synchronous DRAM 3 to the multiplexed terminal.

<Assigning Functions to the Multiplexed Interface Terminals>

FIG. 5 is a plan view illustrating a relationship between the function arrangement assigned to multiplexed terminals of the baseband processor 1 and the terminal arrangement of the application processor 2 connected with the baseband processor 1 according to the first system configuration illustrated in FIG. 1. A cross sectional view taken along the line A-A of FIG. 5 illustrates the vertical device structure and corresponds to FIG. 3.

As illustrated in FIG. 1, the external terminals 202 for the application processor 2 are arranged in a matrix on the bottom of the second wiring substrate 200, in a plan view. Basically, the application processor interface 21 includes interface terminals such as an input terminal group 202_*i* of input terminals, an output terminal group 201_*o* of output terminals, and an input/output terminal group 202_*io* of input/output terminals. The input terminal group 202_*i* is formed in two rows from the outermost periphery around the central portion thereof opposite to the edge of the first wiring substrate 100 and contains eight terminals for convenience sake. The output terminal group 202_*o* is formed two by four rows with reference to the outermost periphery toward one corner from the central portion of the side opposite to the edge of the first wiring substrate 100 and contains eight terminals for convenience sake. The input/output terminal group 202_*io* is formed two by four rows with reference to the outermost periphery toward the other corner from the central portion of the side opposite to the edge of the first wiring substrate 100 and contains eight terminals for convenience sake.

The external terminals 102 of the baseband processor 1 are formed in rows along the edges on the mounting, face of the first wiring substrate 100, in a plan view. That is, the external terminals 102 are circumferentially arranged in two rows along, the outer periphery and are arranged in a matrix at the central portion with an intermediate circumferential space. The two rows along the outer periphery exemplify a first, external terminal group (outer periphery terminal group) 102_1 arranged at the outer periphery on the mounting face of the first wiring substrate 100. The matrix arrangement at the central portion exemplifies a second external terminal group (inner periphery terminal group) 102_2 arranged toward the central portion of the mounting face away from the first external terminal group. An interval between the first external terminal group and the second external terminal group is larger than the diameter of the external terminals. In other words, the ensured space equals one circumferential row of external terminals.

The baseband processor 1 faces to the application processor 2 at a first edge 100_1 of the edges on the mounting face of the first wiring substrate 100. The external terminals 102 of the baseband processor 1 include an interface terminal group 102_apif connected with the application processor 2. The terminals illustrated as blank circles in the drawing are not included in the interface terminal group 102_apif. It should be noted that the terminals are not included in the terminal region while the drawing might possibly cause a misunderstanding about some terminals seemingly included in the same.

The interface terminal group 102_aif is arranged along the first edge 100_1 of the first wiring substrate 100 toward the first edge 100_1 on the mounting face of the first wiring substrate 100 away from the central portion on the mounting face of the first wiring substrate 100. The multiple interface terminal groups 102_apif include the multiplexed terminals and non-multiplexed terminals as dedicated terminals that are not multiplexed. The non-multiplexed terminals are illustrated as double circles. When the first external interface function is selected, the interface terminal groups 102_apif are assigned to terminal groups of different signal input/output configurations from each other, that is, input terminal groups 102_i for input, output terminal groups 102_o and 102_onm for output, and input/output terminal groups 102_io and 102_ionm for input/output.

The input terminal up 102_i corresponds to the input terminal group 202_i and exemplifies the first interface terminal group as multiplexed terminals. The input terminal groups 102_o and 102_onm correspond to the output terminal group 202_o. The output terminal group 102_o exemplifies the second interface terminal, group as multiplexed terminals. The output terminal group 102_onm includes non-multiplexed terminals. The input/output terminal groups 102_io and 102_ionm correspond to the input/output terminal group 202_io. The input/output terminal group 102_io exemplifies the third interface terminal group as multiplexed terminals. The input/output terminal group 102_ionm includes non-multiplexed terminals.

As illustrated in FIG. 5, the input terminal group 102_i as the first interface terminal group is arranged in a first direction (horizontal direction in FIG. 5) across (orthogonal to) the first edge 100_1, in a p_an view. The input terminal group 102_i is distributed to the first external terminal group 102_1 and the second external terminal group 102_2.

As illustrated in FIG. 5, the output terminal group 102_o as the second interface terminal group is arranged in the first direction (horizontal direction in FIG. 5). Similarly to the input terminal group 102_i, the output terminal group 102_o is also distributed to the first external terminal group 102_1 and the second external terminal group 102_2. The output terminal group 102_o is arranged between the first interface terminal group 102_i and a second edge 100_2 crossing to one end part of the first edge 100_1, in the plan view. In other words, as illustrated in FIG. 5, the output terminal group 102_o as the second interface terminal group is arranged along the first edge 100_1 adjacently to the input terminal group 102_i as the first interface terminal group.

As illustrated in FIG. 5 input/output terminal group 102_io as the third interface terminal group is arranged in the first direction (horizontal direction in FIG. 5). Similarly to the input terminal group 102_i, the input/output terminal group 102_io is also distributed to the first external terminal group 102_1 and the second external terminal group 102_2. The input/output terminal group 102_io is arranged between the first interface terminal group 102_i and the second edge (opposite to the first edge) 100_2 crossing to the other end part of the first edge 100_1. In other words, as illustrated in FIG. 5, the input/output terminal group 102_io as the third interface terminal group is arranged along the first edge 100_1 adjacently to the input terminal group 102_i as the first interface terminal group (opposite to the output terminal group 102_o).

Figure 9:
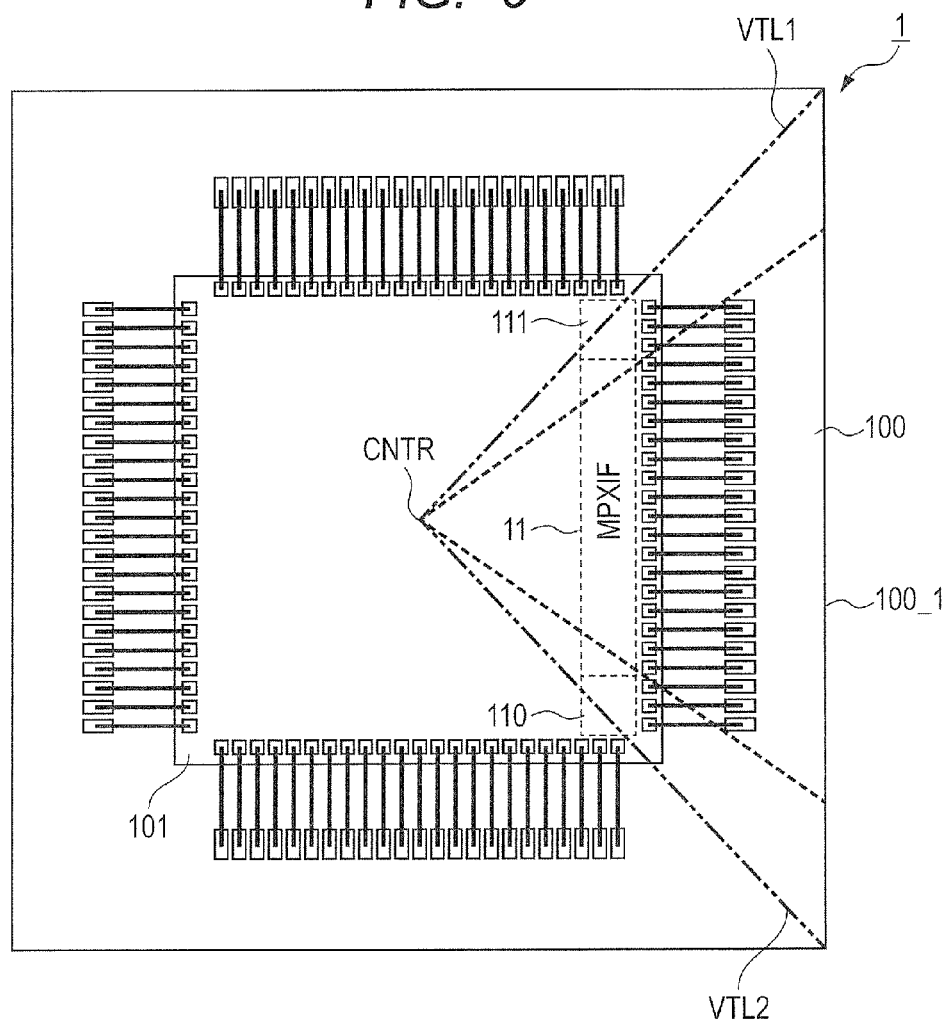
FIG. 9 is an explanatory diagram illustrating a technique of specifying arrangement areas for an input terminal group, an output terminal group, and an input/output terminal group on the mounting face of a first wiring substrate.

The input terminal group 102_i, the output terminal group 102_o, and the input/output terminal group 102_io may be arranged in regions on the mounting face of the first wiring substrate 100 as illustrated in FIG. 9. FIG. 9 is a transparent plan view of the baseband processor 1 such that the baseband processor chip 101 is visible. In FIG. 9, the interface terminal group 102_apif is arranged to be included in a region formed by the first edge 100_1 of the first wiring substrate 100 and virtual lines VTL1 and VTL2 connecting the central portion CNTR of the mounting face with both end parts of the first edge 100_1. Other circuits 111 and 112 are arranged adjacently to the circuit MPXIF. This enables an empirical rule for the arrangement efficiency in consideration of the relationship between the arrangement of the circuit MPXIF formed on the baseband processor chip 101 and the arrangement of the external terminal group 102_apif for external interface of the circuit MPXIF. It is possible to prevent the relationship with the other circuits 111 and 112 from causing great difficulty in determining the entire wiring path for the wiring substrate 100.

FIG. 6 is a plan view illustrating a relationship between the function arrangement assigned to multiplexed interface terminals of the baseband processor 1 and the terminal arrangement of the synchronous DRAM 3 connected with the baseband processor 1 according to the second system configuration illustrated in FIG. 2. A vertical structure of the device taken along the line B-B of FIG. 6 corresponds to FIG. 4.

Basically, external terminals 302 of the synchronous DRAM 3 illustrated in FIG. 2 are formed and arranged in three rows from the outermost periphery on the bottom of the third wiring substrate 300, in a plan view. Basically, interface terminals for the memory interface 31 include data-based terminal groups 302_dq and 302_dqs and command/address-based terminal groups 302_ca and 302_ck for different signal uses. Basically, the data-based terminal group 302_dq provides multi-bit data terminals. The data-based terminal group 302_dqs provides data strobe terminals configuring differential pairs (differential signal pairs). The command/address-based terminal group 302_ca provides multi-bit command and address terminals. The command/address-based terminal group 302_ck provides clock terminals configuring differential pairs. The data-based terminal groups 302_dq and 302_dqs are formed in three rows from the outermost periphery, around the central portion of one edge 300_1 of the parallel edges of the third wiring substrate 300 and contain 21 terminals for convenience sake. The command/address-based terminal groups 302_ca and 302_ck are formed in three rows from the outermost periphery around the central portion of the other edge 300_2 of the parallel edges of the third wiring substrate 300 and contains 21 terminals for convenience sake.

As described above, the external terminal 102 of the baseband processor 1 includes the interface terminal group 102_apif. When the second external interface function is selected, the interface terminal group 102_apif is assigned to terminal groups for different signal uses, that is data-based terminal groups 102_dq, 102_dqnm, and 102_dqsnm as data based terminals and command/address-based terminal groups 102_ca, 102_canm, and 102_cknm as command/address-based terminals.

The data-based terminal groups 102_dq, 102_dqnm, and 102_dqsnm correspond to the data-based terminal groups 302_dq and 302_dqs. The data-based terminal group 102_dq exemplifies a fourth interface terminal group as multiplexed terminals. The data terminal group 102_dqnm and the data strobe terminal group 102_dqsnm provide non-multiplexed terminals. The command/address-based terminal groups 102_ca, 102_canm, and 102_cknm correspond to the command/address-based terminal groups 302_ca and 302_ck. The command/address-based terminal group 102_ca exemplifies a fifth interface terminal group as multiplexed terminals. The command/address terminal group 102_canm and the clock terminal group 102_cknm provide non-multiplexed terminals. The data strobe terminal group 102_dqsnm and the clock terminal group 102_cknm configure differential pairs. These terminal groups are provided as non-multiplexed terminals to prevent the differential signal functionality from degrading due to a multiplexed circuit configuration The data-based terminal groups 102_dq, 102_dqnm, and 102_dqsnm as the fourth interface terminal group are arranged adjacently to the command/address-based terminal groups 102_ca, 102_canm, and 102_cknm as the fifth interface terminal group along the first edge 100_1, in a plan view. The fourth interface terminal group is distributed to the first external terminal group 102_1 and the second external terminal group 102_2. The command/address-based terminal groups 102_ca, 102_canm, and 102_cknm as the fifth interface terminal group are arranged between a collection of the data-based terminal groups 102_dq, 102_dqnm, and 102_dqsnm and a third edge 100_3 crossing to the first edge 100_1. The fifth interface terminal group is distributed to the first external terminal group 102_1 and the second external terminal group 102_2.

According to the second system configuration, the interface terminal group 102_apif is arranged adjacently to the data-based terminal groups 302_dq and 302_dqs of the synchronous DRAM 3. Regarding memory operation on the synchronous DRAM 3, data-based signals tend to change more frequently than command/address-based signals. Shortening signal paths for the signals can improve the noise resistance.

Figure 7:
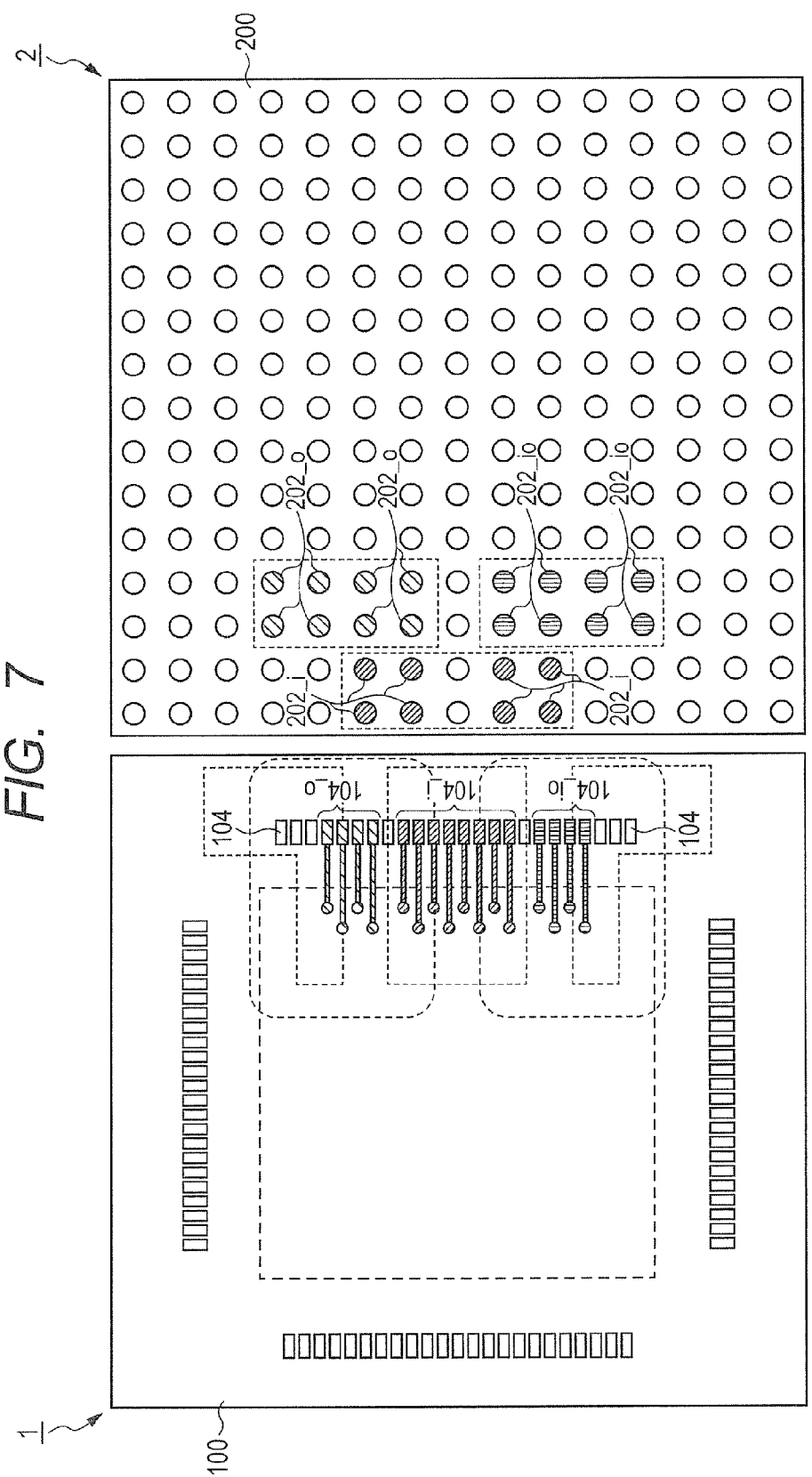
FIG. 7 is an explanatory diagram illustrating a partial wiring path leading to the interface terminal group from bonding pads of the baseband processor according to the first system configuration.

FIG. 7 is a transparent plan view of the baseband processor 1 according to the first system configuration and illustrates a partial wiring path from the bonding pad 104 to the interface terminal group 102_apif of the baseband processor 1. The bonding pad 104 corresponding to the interface terminal group 102_apif of the baseband processor 1 is classified into an output pad group 104_o, an input, pad group 104_i, and an input/output pad group 104_io. The output pad group 104_o, the input pad group 104_i, and the input/output pad group 104_io are arranged in the same order as the arrangement of the output terminal group 102_o, the input terminal group 102_i, and the input/output terminal group 102_io illustrated in FIG. 5. The wiring in the wiring substrate 100 can be easily grouped according to the signal input/output functions from the output pad group 104_o, the input pad group 104_i, and the input/output pad group 104_io to the output terminal group 102_o, the input terminal group 102_i, and the input/output terminal group, 102_io. Though not illustrated, bonding wires are led from the multiplexed interface 11 to the output pad group 104_o, the input pad group 104_i, and the input/output pad group 104_io. The bonding wires can be also easily grouped according to the signal functions.

Signal transmission with high signal density between the processors 1 and 2 can alleviate or reduce crosstalk between bonding wires or wires in the wiring substrate 100.

In FIG. 7, the output pad group 104_o and the input/output pad group 104_io are illustrated to contain a smaller number of pads than the actual quantity for convenience sake.

Figure 10:
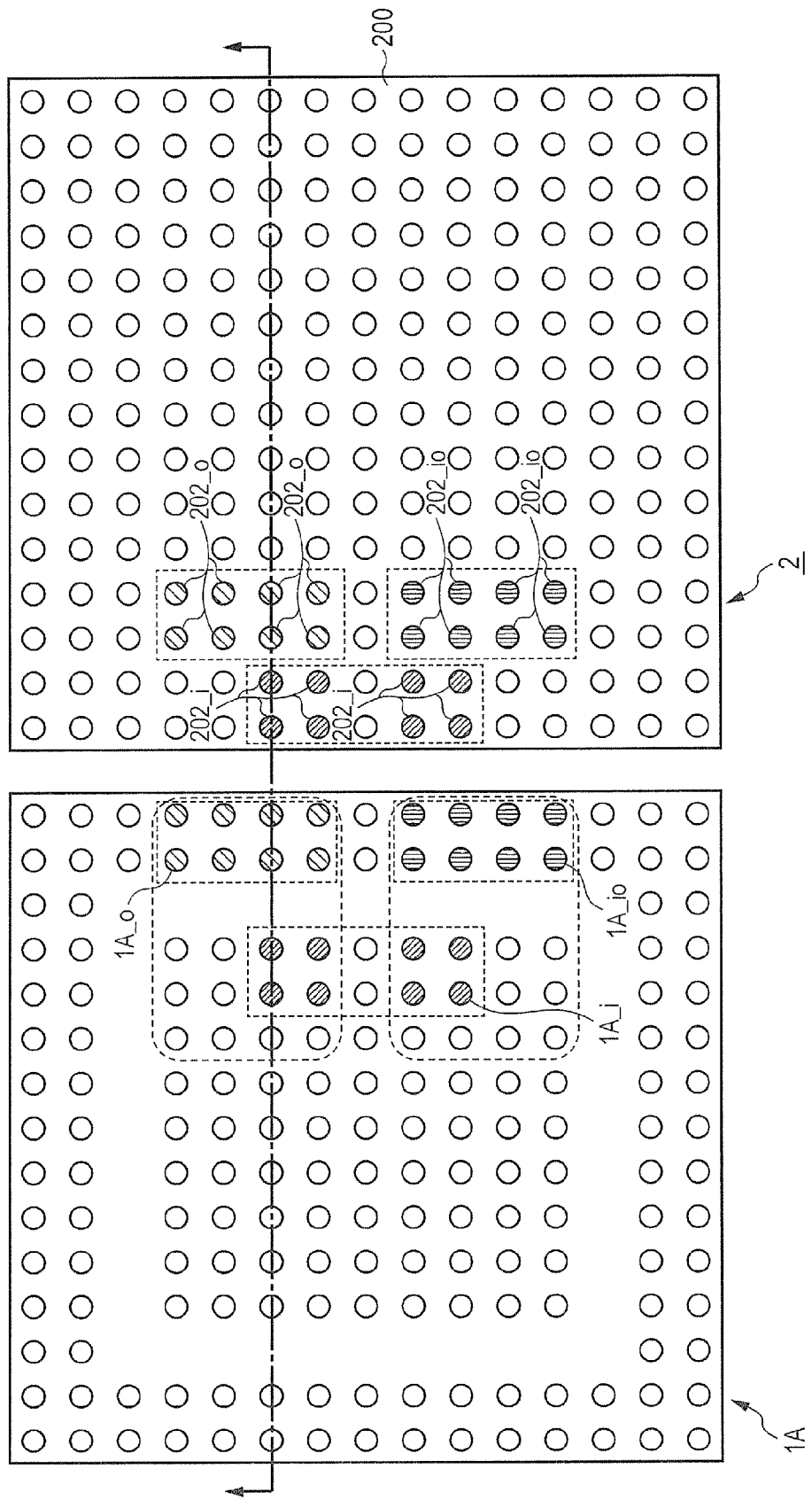
FIG. 10 is a plan view illustrating a comparative example of the external terminal arrangement when settling the arrangement of multiplexed terminals or the baseband processor merely based on the terminal arrangement of the application processor to be connected in multiplexed mode.
Figure 11:
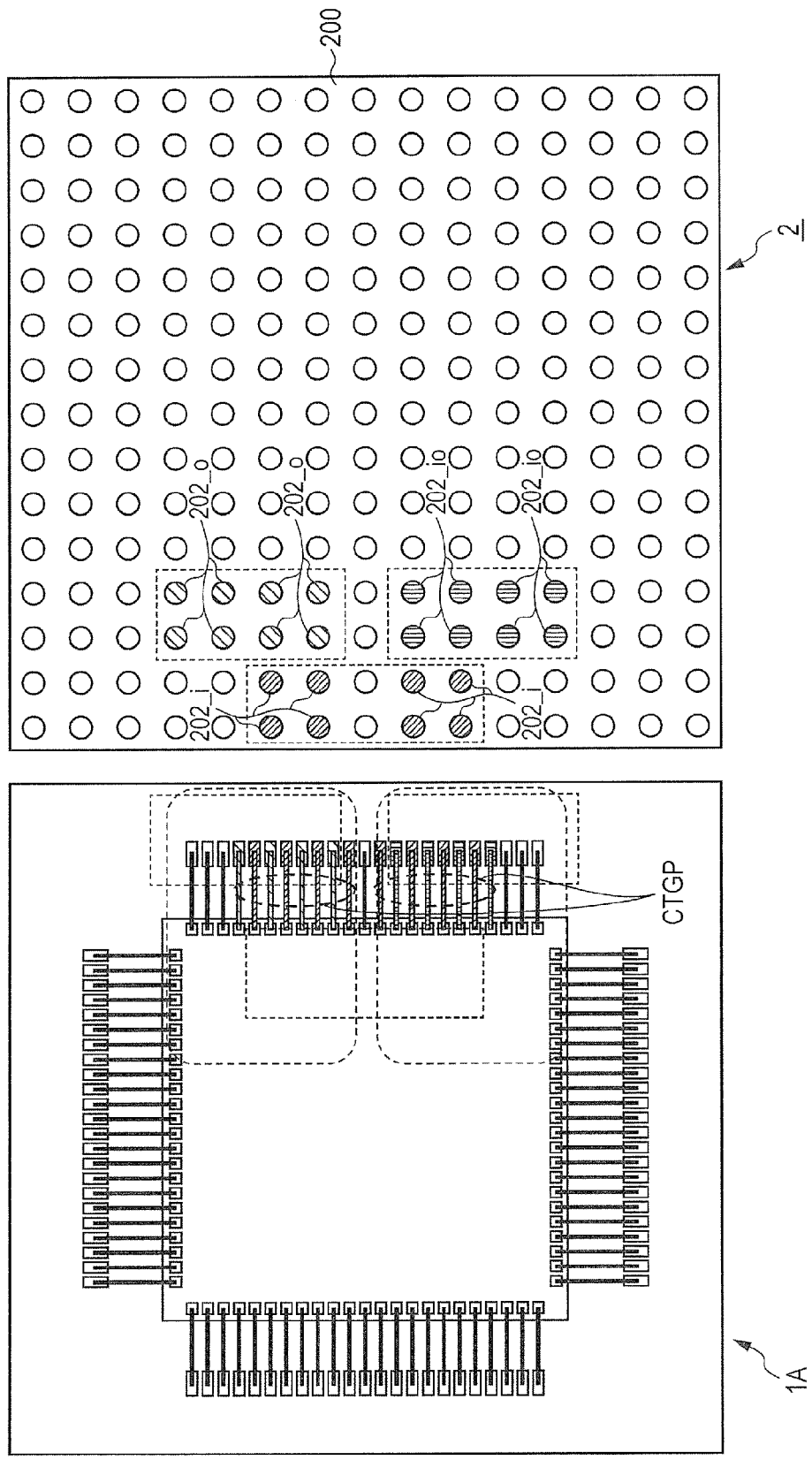
FIG. 11 is a plan view illustrating a comparative example of the bonding wire arrangement when settling the arrangement of multiplexed terminals for the baseband processor merely based on the terminal arrangement of the application processor to be connected in multiplexed mode.
Figure 12:
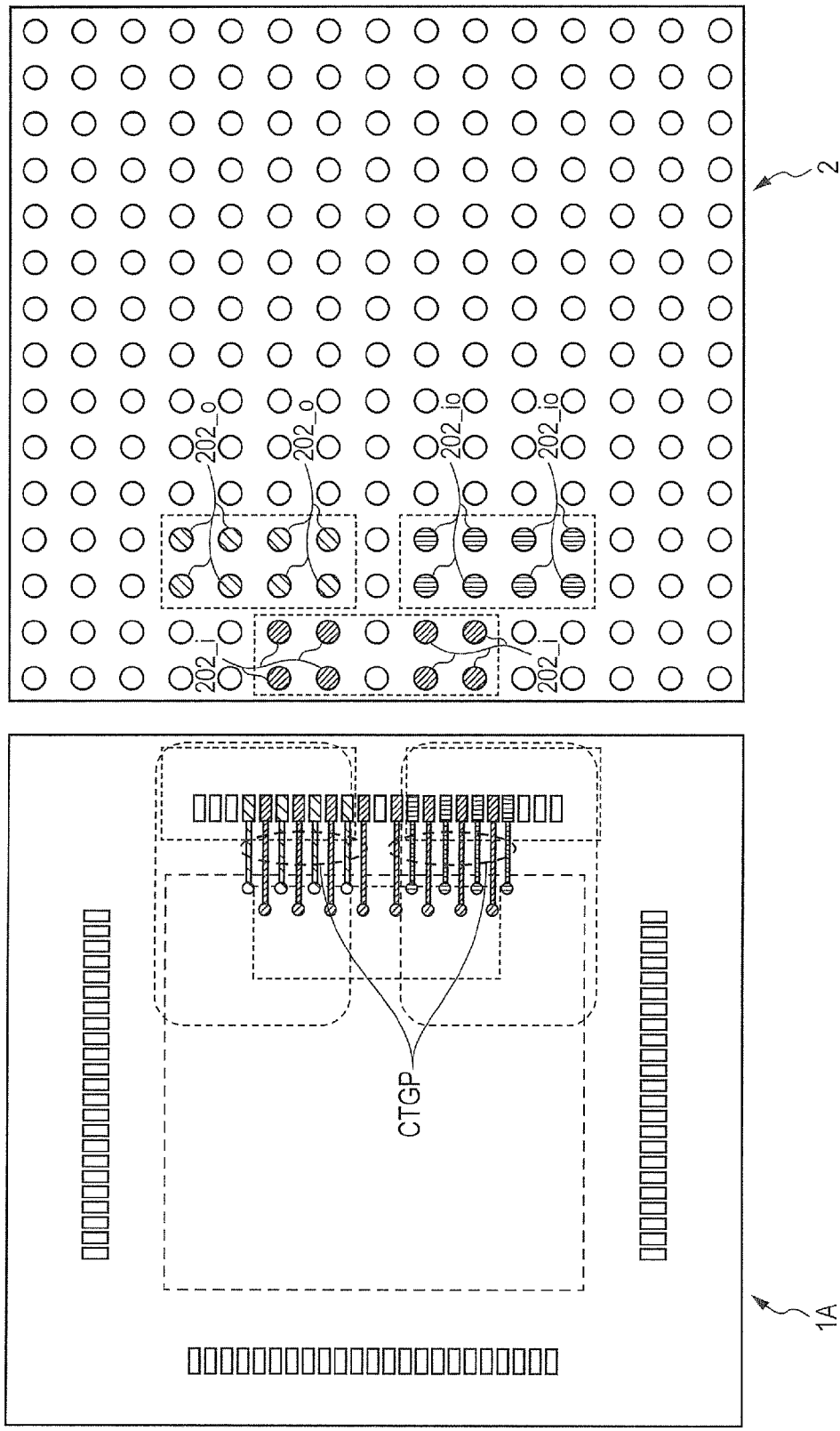
FIG. 12 is a plan view illustrating a comparative example of a wiring layer in the wiring substrate when settling the arrangement of multiplexed terminals for the baseband processor merely based on the terminal arrangement of the application processor to be connected in multiplexed mode.

FIGS. 10 through 12 provide comparative examples focused on problems of settling the arrangement of multiplexed terminals for the baseband processor merely based on the terminal arrangement of the application processor to be connected in multiplexed mode. FIG. 10 settles the arrangement of multiplexed terminals 1A_o, 1A_i, and 1A_i for a baseband processor 1A merely based on the terminal groups 202_o, 202_io, and 202_i to be connected in multiplexed mode. Consequently, as illustrated in FIG. 11, signals with different input/output functions are adjacent to each other at several locations as illustrated by a crosstalk noise generation point CTGP in FIG. 11. As illustrated in FIG. 12, the wiring on a wiring substrate 100A in the baseband processor 1A accordingly causes signals with different input/output functions to be adjacent to each other at several locations as illustrated by the crosstalk noise generation point CTGP in FIG. 12. Therefore the comparative examples in FIGS. 10 through 12 cannot prevent a crosstalk from occurring on the bonding wire arrangement in the baseband processor 1A or the wiring the wiring substrate 100A.

Figure 8:
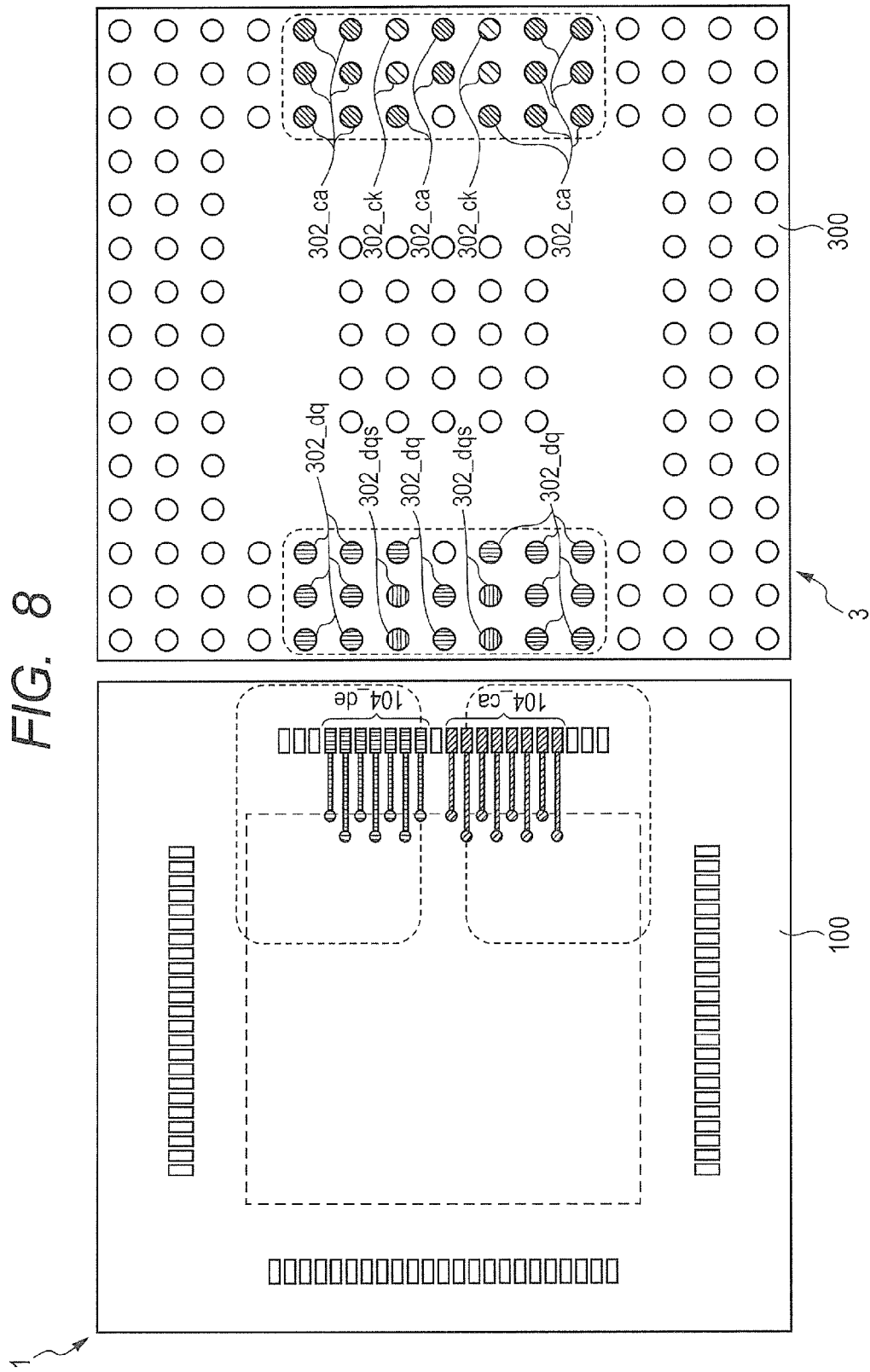
FIG. 8 is an explanatory diagram illustrating a partial wiring path leading to the interface terminal group from bonding pads of the baseband processor according, to the second system configuration.

FIG. 8 is a transparent plan view of the baseband processor 1 according to the second system configuration and illustrates a partial wiring path leading to the interface terminal group 102_apif from bonding pads 104 of the baseband, processor 1. When the second interface function is selected, the bonding pads 10 corresponding to the interface terminal group 102_apif for the baseband processor 1 are classified into a data-based pad group 104_dt for data and data strobe signals and a command/address-based pad group 104_ca for commands, addresses, and clocks. The data-based pad group 104_dt and the command/address-based pad group 104_ca are arranged in the same order as the arrangement of the data-based terminal groups 102_dq, 102_dqs, 102_dqnm, and 102_dqsnm and the command/address-based terminal groups 102_ca, 102_canm, and 102_cknm illustrated in FIG. 6. The wiring substrate 100 includes wiring from the data-based pad group 104_dt and the command/address-based pad group 104_ca to the data-based terminal groups 102_dq, 102_dqs, 102_dqnm, and 102_dqsnm and the command/address-based terminal groups 102_ca, 102_canm, and 102_cknm. The wiring can be easily grouped according to, the signal uses. Though not illustrated, bonding wires are led from the multiplexed interface circuit 11 to the data-based pad group 104_dt and the command/address-based pad group 104_ca. The bonding wires can be also easily grouped according to the signal uses.

Unlike the first system configuration, the second system configuration does not aim to reduce crosstalk according to the signal input/output types. Firstly, this is because the second system configuration uses interface signal types fewer than the interprocessor interface and accordingly lowers the signal change density. Secondly, this is because data-based and command/address-based signals greatly differ in signal change densities Separately arranging data-based and command/address-based signals may be effective in order to reduce crosstalk.

<Manufacturing the Baseband Processor>

The following concisely describes processes to manufacture the baseband processor 1. A technology of manufacturing the baseband processor 1 mainly includes: 1) substrate provision process: 2) chip mount (die bonding) process; 3) wire bonding process; 4) mold process 5) ball mount process; and 6) cutting (dicing) process.

1) Substrate Provision Process

The substrate provision process requires provision of a base material. The base material used for the embodiment is a so called multi-piece substrate and includes device regions (package formation regions) and dicing regions. The dicing region is located between two adjacent ones of the device regions. In other words, the dicing region is located around each device region. The dicing divides the device regions into the above-mentioned wiring substrates 100. As described above, the wiring substrate 100 is rectangular, in a plan view. Electrode pads (bonding leads and bump lands) are formed on both faces of the wiring substrate 100.

2) Chip Mount (Die Bonding) Process

The chip mount (die bonding) process will be described. The chip mount process mounts the baseband processor chip 101 on the device region of the base material. An adhesive material (die bonding material) is used to mount the baseband processor chip 101 on the outer surface (chip mounting surface) of the base material that contain the device regions. In more detail, the baseband processor chip 101 is mounted on the outer surface of the base material (substrate) through the adhesive material, such that the rear surface (back side) of the baseband processor chip 101 faces the outer surface of, the base material. The baseband processor chip 101 is mounted such that electrode pads (bonding leads) 104 formed on the outer surface of the material are exposed from the baseband processor chip 101. The adhesive material according to the embodiment is provided as an insulating film, for example. The adhesive material may be also provided in paste form (fluid adhesive).

3) Wire Bonding Process

The electrode pads 103 for the baseband processor chip 101 and the electrode pads 104 for the device regions 401 are electrically connected through the wires 105 as conductive members.

4) Mold Process

The mold process will be described.

The mold process places the base material (multi-piece substrate) mounted on the baseband processor chip 101 in a mold (not shown). The baseband processor chip 101 and the wires 105 are sealed with resin to form a sealed unit. The embodiment covers the baseband processor chips 101 corresponding to the device regions with one cavity formed in the mold (not shown). The baseband processor chips 101 (or the device regions) are sealed at a time. As a result, the resin also covers the outer surface of the dicing region located between two adjacent device regions. The embodiment uses an epoxy thermosetting resin, for example.

5) Ball Mount Process

The sealed unit is formed on the substrate that is then removed from the mold (not shown). The electrode pads (bump lands) are formed on the rear surface of the device regions. Solder balls (solder) 102 as external terminals are formed (connected) on the electrode pads.

The solder ball 102 according to the embodiment uses a so-called lead-free solder, that is, an alloy of tin (Sn) silver (Ag), and copper (Cu), for example. The lead-free solder is defined as containing the lead (Pb) of 1000 ppm (0.1 wt %) or less based on the RoHS (Restriction of Hazardous Substances) directive. The solder containing the tin (Sn) easily diffuses the copper (Cu). The embodiment is applicable to solder containing the lead (Pb) as well as the lead-free solder. However, it is recommended to use the lead-free solder as described in the embodiment in consideration of antipollution measures.

6) Cutting (Dicing) Process

Cutting the base material (multi-piece substrate) of the sealed unit separates the device regions from the base material. In more detail a dicing blade (not shown) travels in the dicing area on the base material to separate the device regions, where the external terminals are, formed, from, the base material.

While there has been described the specific preferred embodiment of the present invention created by the inventors it is to be distinctly understood that the present invention is not limited thereto but may be otherwise variously embodied within the spirit and scope of the invention.

<First Modification>

The embodiment has described the examples of using so-called batch molding technology. For each of the semiconductor devices 1, 2, and 3, semiconductor chips are mounted at the device regions formed on the wiring substrate and are covered with one cavity (a recess formed in the mold). The semiconductor chips are then sealed with a resin at a time. The semiconductor device is acquired by cutting the wiring substrate and the resin (sealed unit) that overlaps the dicing region (formed between the device regions) on the wiring substrate. However, the invention is not limited thereto. A so-called discrete molding technology may be used instead. This technology covers semiconductor chips formed on the wiring substrate with respective cavities, seals the chips with a resin, and then cuts only the wiring substrate to acquire the semiconductor devices.

<Second Modification>

The semiconductor device such as the baseband processor may use external terminals made of the solder containing lead instead of the lead-free solder.

<Third Modification>

The baseband processor may directly access, memory such as the synchronous DRAM without passing through the application processor while the synchronous DRAM is arranged next to the application processor.

<Fourth Modification>

The synchronous DRAM may be available as single data rate memory, double data rate memory such as DDRSDRAM and DDR2SDRAM, quad data rate memory such as DDR3SDRAM, or memory with low power consumption such as LPDDRSDRAM. The memory is not limited to the synchronous DRAM but may be available as synchronous SRAM or other types of memory. The semiconductor device is not limited to the baseband processor but may be available as a microcomputer having the multiplexed interface to enable data processing or a system-on-chip semiconductor device <Fifth Modification>

There has been described that the synchronous DRAM 3 uses the same arrangement of external terminals for convenience sake according to the first system configuration in FIG. 3 and the second system configuration in FIG. 4. However, the invention is not limited thereto. A POP (Package On Package) structure as illustrated in FIG. 3 mounts packages such as the application processor 2 and the synchronous DRAM 3 to overlap with each other. The synchronous DRAM 3 must be arranged such that its external terminals avoid the application processor chip underneath. On the other hand, FIG. 4 illustrates the arrangement that need not mount the packages to overlap with each other. In this case, the external terminals of the synchronous DRAM 3 may be arranged on the entire bottom surface.

<Sixth Modification>

The electronic device is not limited to mobile terminals but may be applicable to other communication devices audiovisual devices, car navigation devices, television sets, and various devices mounted with electronic circuits.

<Seventh Modification>

The above-mentioned modifications may be combined with each other within the spirit and scope of the invention described in the embodiment.

What is claimed is:

1. An electronic device comprising:
   a mounting board;
   a first semiconductor device mounted over the mounting board, the first semiconductor device including a first wiring substrate, a first semiconductor chip mounted over a chip mounting surface of the first wiring substrate, and a plurality of external terminals electrically connected with the first semiconductor chip and formed on a mounting face opposite to the chip mounting surface of the first wiring substrate; and
   a second semiconductor device mounted over the mounting board, and electrically connected with the first semiconductor device, the second semiconductor device including a second wiring substrate, a second semiconductor chip mounted over a chip mounting surface of the second wiring substrate, and a plurality of external terminals electrically connected with the first semiconductor device and formed on a mounting face opposite to the chip mounting surface of the second wiring substrate,
   wherein the external terminals of the first semiconductor device are formed in a plurality of rows and arranged along each edge of the mounting face of the first wiring substrate, in a plan view,
   wherein the external terminals of the first semiconductor device include a first external terminal group arranged at a peripheral portion side of the mounting face of the first wiring substrate, and a second external terminal group arranged further at a central portion side of the mounting face thereof than the first external terminal group,
   wherein an interval between the first external terminal group and the second external terminal group is larger than a diameter of each of the external terminals,
   wherein the first semiconductor device is mounted over the mounting board such that a first edge of edges of the mounting face of the first wiring substrate faces the second semiconductor device,
   wherein the external terminals of the first semiconductor device include a plurality of interface terminals connected with the second semiconductor device,
   wherein the interface terminals are arranged along the first edge of the mounting face of the first wiring substrate and arranged further at the first edge side of the mounting face thereof than the central portion of the mounting face thereof,
   wherein the interface terminals include multiplexed terminals, including a first interface terminal group, a second interface terminal group and a third interface terminal group, having different signal input/output configurations from each other,
   wherein the first interface terminal group, the second interface terminal group and the third interface terminal group are distributed to the first external terminal group and the second external terminal group,
   wherein the second interface terminal group is arranged between the first interface terminal group and a second edge crossing to one end part of the first edge, in the plan view, and
   wherein the third interface terminal group is arranged between the first interface terminal group and a third edge crossing to another end part of the first edge, in the plan view,
   wherein the first semiconductor device is a baseband processor that provides specified communication protocol control for the electronic device,
   wherein the second semiconductor device is an application processor that provides control other than the communication protocol control for the electronic device, and
   wherein each of the first interface terminal group, the second interface terminal group, and the third interface terminal group is assigned one of signal input/output configurations for an input terminal, an output terminal, and an input/output terminal without duplication.

2. The electronic device according to claim 1, further comprising:
   a third semiconductor device electrically connected with the second semiconductor device, including a third wiring substrate, a third semiconductor chip mounted over a chip mounting surface of the third wiring substrate, and a plurality of external terminals electrically connected with the third semiconductor chip and formed on a mounting face opposite to the chip mounting surface of the third wiring substrate.

3. The electronic device according to claim 2,
   wherein the third semiconductor device is synchronous Dynamic random-access memory (DRAM).

4. The electronic device according to claim 1,
   wherein the interface terminals are arranged in a region formed by the first edge of the first wiring substrate and virtual lines connecting a central portion of the mounting face with both end parts of the first edge.

5. A semiconductor device to be mounted over a mounting board mounted with an electronic component, the semiconductor device comprising:
   a first wiring substrate;
   a semiconductor chip mounted over a chip mounting surface of the wiring substrate; and
   a plurality of external terminals electrically connected with the semiconductor chip and formed on a mounting face opposite to the chip mounting surface of the wiring substrate,
   wherein the external terminals of the semiconductor device are formed in a plurality of rows and arranged along each edge of the mounting face of the wiring substrate, in a plan view,
   wherein the external terminals of the semiconductor device include a first external terminal group arranged at a peripheral portion side of the mounting face of the first wiring substrate, and a second external terminal group arranged further at a central portion side of the mounting face thereof than the first external terminal group,
   wherein an interval between the first external terminal group and the second external terminal group is larger than a diameter of each of the external terminals,
   wherein the external terminals of the semiconductor device include a plurality of interface terminals connected with the electronic component, wherein the interface terminals are arranged along a first edge of the mounting face of the wiring substrate and arranged further at the first edge side of the mounting face there of than the central portion of the mounting face thereof, wherein the interface terminals include multiplexed terminals, such as a first interface terminal group, a second interface terminal group and a third interface terminal group having different signal input/output configurations from each other, wherein the first interface terminal group, the second interface terminal group and the third interface terminal group are distributed to the first external terminal group and the second external terminal group, wherein the second interface terminal group is arranged between the first interface terminal group and a second edge crossing to one end part of the first edge, in the plan view, and wherein the third interface terminal group is arranged between the first interface terminal group and a third edge crossing to another end part of the first edge, in the plan view, wherein the first semiconductor device is a baseband processor that provides specified communication protocol control for the electronic device, wherein, when one function is selected for a plurality of interface terminals including the multiplexed terminal, each of the first interface terminal group, the second interface terminal group, and the third interface terminal group is assigned one of signal input/output configurations for an input terminal, an output terminal, and an input/output terminal without duplication, and wherein, when another function is selected, each of part of the first interface terminal group and the second interface terminal group and part of the first interface terminal group and the third interface terminal group is assigned one of signal uses for a command/address-based terminal function and a data-based terminal function of memory without duplication.

6. The semiconductor device according to claim 5, wherein the interface terminals are arranged in a region formed by the first edge of the first wiring substrate and virtual lines connecting a central portion of the mounting face with both end parts of the first edge.

7. An electronic device comprising:

a mounting board;

a first semiconductor device mounted over the mounting board, the first semiconductor device including a first wiring substrate, a first semiconductor chip mounted over a chip mounting surface of the first wiring substrate, and a plurality of external terminals electrically connected with the first semiconductor chip and formed on a mounting face opposite to the chip mounting surface of the first wiring substrate; and a second semiconductor device mounted over the mounting board, and electrically connected with the first semiconductor device, the second semiconductor device including a second wiring substrate, a second semiconductor chip mounted over a chip mounting surface of the second wiring substrate, and a plurality of external terminals electrically connected with the first semiconductor device and formed on a mounting face opposite to the chip mounting surface of the second wiring substrate, wherein the external terminals of the first semiconductor device are formed in a plurality of rows and arranged along each edge of the mounting face of the first wiring substrate, in a plan view, wherein the first semiconductor device is mounted over the mounting board such that a first edge of edges of the mounting face of the first wiring substrate faces the second semiconductor device, wherein the external terminals of the first semiconductor device include a plurality of interface terminals connected with the second semiconductor device, wherein the interface terminals include a plurality of multiplexed terminals capable of dynamically assigning functions corresponding to an interface function assigned to the first semiconductor chip, wherein, when the first semiconductor chip is assigned an interface function with the second semiconductor device, the multiplexed terminals are assigned as a first interface terminal group, a second interface terminal group, and a third interface terminal group having different signal input/output configurations from each other, and this assignment differs from assignment of the multiplexed terminals to a fourth interface terminal group and a fifth interface terminal group having different signal input/output configurations from each other when the first semiconductor chip is assigned an interface function with a semiconductor device other than the second semiconductor device, wherein the first interface terminal group is arranged adjacently to the second interface terminal group along the first edge of the mounting face of the first wiring substrate, in the plan view, wherein the second interface terminal group is arranged between the first interface terminal group and a second edge crossing to one end part of the first edge, in the plan view, and wherein the third interface terminal group is arranged between the first interface terminal group and a third edge crossing to another end part of the first edge, in the plan view, wherein the first semiconductor device is a baseband processor that provides specified communication protocol control for the electronic device, wherein the second semiconductor device is an application processor that provides control other than the communication protocol control for the electronic device, wherein each of the first interface terminal group, the second interface terminal group and the third interface terminal group is assigned one of signal input/output configurations for an input terminal, an output terminal, and an input/output terminal without duplication, and wherein each of the fourth interface terminal group and the fifth interface terminal group is assigned one of signal uses for a command/address-based terminal and a data-based terminal of synchronous Dynamic random-access memory (DRAM) without duplication.

8. The electronic device according to claim 7, further comprising:

a third semiconductor device electrically connected with the second semiconductor device, including a third wiring substrate, a third semiconductor chip mounted over a chip mounting surface of the third wiring substrate, and a plurality of external terminals electrically connected with the third semiconductor chip and formed on a mounting face opposite to the chip mounting surface of the third wiring substrate.

9. The electronic device according to claim 8, wherein the third semiconductor device is synchronous DRAM.

10. A semiconductor device comprising a wiring substrate, a semiconductor chip mounted on a chip mounting surface of the wiring substrate, and a plurality of external terminals electrically connected with the semiconductor chip and formed on a mounting face opposite to the chip mounting surface of the wiring substrate, wherein the external terminals of the semiconductor device are formed in a plurality of rows and arranged along each edge of the mounting face of the wiring substrate, in a plan view, wherein the external terminals of the semiconductor device include a plurality of interface terminals connectable to other semiconductor devices, wherein the interface terminals include a plurality of multiplexed terminals capable of dynamically assigning functions corresponding to an external interface function assigned to the semiconductor chip, wherein, when a first external interface function is specified as the external interface function, the multiplexed terminals are assigned as a first interface terminal group, a second interface terminal group, and a third interface terminal group having different signal input/output configurations from each other, wherein, when a second external interface function is specified as the external interface function, the multiplexed terminals are assigned as a fourth interface terminal group and a fifth interface terminal group having different signal uses from each other, wherein the first interface terminal group is arranged adjacently to the second interface terminal group along the first edge of the mounting face of the wiring substrate, in the plan view, wherein the second interface terminal group is arranged between the first interface terminal group and a second edge crossing to one end part of the first edge, in the plan view, wherein the third interface terminal group is arranged between the first interface terminal group and a third edge crossing to another end part of the first edge, in the plan view, wherein the fourth interface terminal group is arranged adjacently to the fifth interface terminal group along the first edge of the mounting face of the wiring substrate, in the plan view, and wherein the fifth interface terminal group is arranged between the fourth interface terminal group and an edge crossing to the first edge, in the plan view, wherein the semiconductor device is a baseband processor that provides specified communication protocol control, wherein, when one function is selected for a plurality of interface terminals including the multiplexed terminals, each of the first interface terminal group, the second interface terminal group, and the third interface terminal group is assigned one of signal input/output configurations for an input terminal, an output terminal, and an input/output terminal without duplication, and wherein, when another function is selected for a plurality of interface terminals including the multiplexed terminals, each of the fourth interface terminal group and the fifth interface terminal group is assigned one of signal uses for a command/address-based terminal and a data-based terminal of synchronous Dynamic random-access memory (DRAM) without duplication.

11. The semiconductor device according to claim 10, wherein the interface terminals are provided with a fixed terminal function and include a plurality of non-multiplexed terminals used for connection to the synchronous DRAM, and wherein the non-multiplexed terminals include differential terminals for data strobe signals configuring differential pairs and include differential terminals for clock signals configuring differential pairs.

12. The semiconductor device according to claim 10, further comprising:

a storage circuit that configures one of the first external interface function and the second external interface function.

* * * * *